United States Patent
Maeda et al.

(10) Patent No.: US 9,110,350 B2
(45) Date of Patent: *Aug. 18, 2015

(54) COLOR CONVERSION FILTER

(75) Inventors: Yosuke Maeda, Tokyo (JP); Koichi Shigeno, Tokyo (JP); Tomoyuki Ariyoshi, Tokyo (JP); Mitsuhiro Okada, Tokyo (JP); Yukiko Kanehara, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 233 days.

This patent is subject to a terminal disclaimer.

(21) Appl. No.: 13/817,085

(22) PCT Filed: Aug. 10, 2011

(86) PCT No.: PCT/JP2011/068251
§ 371 (c)(1),
(2), (4) Date: Feb. 14, 2013

(87) PCT Pub. No.: WO2012/029520
PCT Pub. Date: Mar. 8, 2012

(65) Prior Publication Data
US 2013/0147345 A1 Jun. 13, 2013

(30) Foreign Application Priority Data
Sep. 3, 2010 (JP) ................................. 2010-198010

(51) Int. Cl.
| | | |
|---|---|---|
| *H05B 33/12* | (2006.01) | |
| *H05B 33/14* | (2006.01) | |
| *H01L 31/052* | (2014.01) | |
| *H01L 33/50* | (2010.01) | |
| *H01L 51/50* | (2006.01) | |
| *C09B 23/00* | (2006.01) | |
| *C09K 11/00* | (2006.01) | |
| *C09K 11/06* | (2006.01) | |
| *G02F 1/35* | (2006.01) | |
| *C09B 23/01* | (2006.01) | |
| *H01L 31/055* | (2014.01) | |
| *H01L 31/0232* | (2014.01) | |
| *G03F 7/00* | (2006.01) | |

(52) U.S. Cl.
CPC .............. *G02F 1/35* (2013.01); *C09B 23/0066* (2013.01); *G03F 7/0007* (2013.01); *H01L 31/0232* (2013.01); *H01L 31/02322* (2013.01); *H01L 31/055* (2013.01); *H05B 33/12* (2013.01); *H05B 33/14* (2013.01); *C09K 2211/1007* (2013.01); *C09K 2211/1029* (2013.01); *H01L 33/502* (2013.01); *Y02E 10/52* (2013.01)

(58) Field of Classification Search
USPC ............. 252/301.35, 301.34, 301.26, 301.31, 252/301.32; 548/455; 313/503; 257/98; 136/257
See application file for complete search history.

(56) References Cited

U.S. PATENT DOCUMENTS

| | | | |
|---|---|---|---|
| 5,030,009 A * | 7/1991 | Ando et al. ................... 356/417 |
| 5,403,686 A * | 4/1995 | Bugner et al. ............... 430/59.1 |
| 6,268,222 B1 | 7/2001 | Chandler et al. | |
| 8,759,540 B2 * | 6/2014 | Maeda et al. ................. 548/455 |
| 2004/0197705 A1 | 10/2004 | Shimizu et al. | |
| 2008/0207918 A1 | 8/2008 | Aoyama et al. | |
| 2008/0252198 A1 | 10/2008 | Katano et al. | |
| 2009/0140639 A1 | 6/2009 | Yasukawa et al. | |
| 2010/0001637 A1 | 1/2010 | Satou | |

FOREIGN PATENT DOCUMENTS

| | | |
|---|---|---|
| JP | 01-244361 | * 9/1989 |
| JP | 04045160 | 2/1992 |
| JP | 8-078158 | 3/1996 |
| JP | 2002-363434 | 12/2002 |
| JP | 2003-077680 | 3/2003 |
| JP | 2004-315789 | 11/2004 |
| JP | 2006-303033 | 2/2006 |
| JP | 2006032022 | 2/2006 |
| JP | 2006-269373 | 10/2006 |
| JP | 2007-199421 | 8/2007 |
| JP | 2008-250022 | 10/2008 |
| JP | 2010-015785 | 1/2010 |
| JP | 2010-186845 | 8/2010 |
| WO | WO 2006/035555 | 4/2006 |
| WO | WO 2006/103907 | 10/2006 |
| WO | WO 2011086785 | * 7/2011 |

OTHER PUBLICATIONS

International Search Report, PCT/JP2011/068251, Sep. 13, 2011.
Extended European search report, dated Apr. 16, 2015, in corresponding European Patent Application No. 11821538.3.
Zhongyu Li, et al., "Large third-order optical nonlinearities of centrosymmetric squaraines with heterocyclic donor groups measured by femtosecond degenerate four-wave mixing technique," Chemical Physics Letters 441 (2007), pp. 123-126.

* cited by examiner

*Primary Examiner* — Carol M Koslow

(74) *Attorney, Agent, or Firm* — Young & Thompson

(57) ABSTRACT

A color conversion filter contains at least one kind of squarylium dye that radiates fluorescence light, has a wavelength conversion capability, absorbs light in an unneeded wavelength region, radiates fluorescence light in a preferable wavelength region, and does not allow decrease in brightness, and thus is preferable for color conversion light-emitting devices, photoelectric conversion devices and the like. Specifically, the color conversion filter has an absorption having a high intensity in the range of 570 to 600 nm, and thus is preferable for use in a color conversion filter that radiates fluorescence light having a high intensity in the range of 600 to 780 nm.

3 Claims, 3 Drawing Sheets

COLOR CONVERSION FILTER

TECHNICAL FIELD

The present invention relates to a color conversion filter that contains a squarylium dye that radiates fluorescence light, and has a wavelength conversion capability. The color conversion filter is a color conversion filter that enables multicolor display with high definition, high brightness and high efficiency, and is also excellent in producibility. The color conversion filter of the present invention is useful for displaying displays such as liquid crystals, PDPs and organic ELs, image sensors, personal computers, word processors, audios, videos, car navigations, telephone sets, mobile terminals and industrial measurement devices and the like, for photoelectric conversion elements such as solar batteries, for illuminations such as fluorescent lamps, LEDs and EL illuminations, for dye lasers, for copy protection, and the like.

BACKGROUND ART

Compounds having an absorption in the visible light region are used as optical elements in optical filters for image display devices such as liquid crystal display devices (LCDs), plasma display panels (PDPs), electroluminescence displays (ELDs), cathode ray tube display devices (CRTs), fluorescence display tubes and electric field radiation type displays.

On the other hand, materials in which electrons that have excited by absorbing energy radiate electromagnetic wave as excess energy when the electrons return to a ground state have a wavelength conversion capability due to the difference in energies for absorption and release, and thus have been conventionally used as color conversion dyes (wavelength conversion dyes) in colorants, pigments, optical filters, films for agriculture and the like, and studies have been actively made on organic compounds since wavelengths for absorption and release are controlled easier than in inorganic compounds. Specifically, compounds that radiate absorbed energy as fluorescence are called as fluorescent dyes, and those radiate fluorescence light of visible light are highly practical and can be used for applications such as display devices such as displays, illumination devices such as fluorescent lamps, and markers in biology and medicine.

In general, fine illumination with excellent color rendition (white color that is seen more naturally) is required for illumination devices (white illuminations for home use and the like), and it is considered that it is preferable to mix three primary colors of RGB so as to obtain excellent color rendition, and it is a problem to obtain luminescent with strong RGB. Specifically, an LED illumination generally has a combination of a blue LED and a yellow phosphor, and an approach to replace the yellow phosphor with red and green phosphors so as to improve color rendition was made, but the approach had a problem that it was expensive and poor in energy efficiency. Furthermore, a consideration to absorb only yellow color from fluorescence so as to improve color rendition was also made in the case when red and green phosphors are used, but the approach could not be considered to be sufficient since the brightness of an illumination decreased by only absorbing yellow color.

Patent Literatures 1 to 6 show squarylium compounds and optical filters using the compounds. Furthermore, Patent Literature 7 shows a photoelectric conversion device (solar cell module) using a color conversion material.

CITATION LIST

Patent Literatures

Patent Literature 1: JP 2002-363434 A
Patent Literature 2: US 2004/197705 A
Patent Literature 3: US 2008/207918 A
Patent Literature 4: JP 2007-199421 A
Patent Literature 5: JP 2008-250022 A
Patent Literature 6: WO 2006/35555 A
Patent Literature 7: JP 2006-303033 A

SUMMARY OF INVENTION

Technical Problem

Therefore, the objects of the present invention are to provide a color conversion filter that radiates fluorescence light, and to further provide a color conversion filter having a wavelength conversion capability, which absorbs 570 to 650 nm (specifically yellow light (570 to 600 nm)) and radiates fluorescence light of orange to red (600 to 780 nm). Furthermore, the further object of the present invention is to provide a color conversion light-emitting device and a photoelectric conversion device using the color conversion filter.

Solution to Problem

The present inventors have done intensive studies and first found use of a squarylium dye that radiates fluorescence light as a wavelength conversion material, and also found that a color conversion filter having a wavelength conversion capability which contains at least one kind of the squarylium dye has a light conversion capability in a preferable wavelength region, and the above-mentioned purpose can be achieved by using this.

The present invention was made based on the above-mentioned findings, and provides a color conversion filter having a wavelength conversion capability, which contains at least one kind of squarylium dye that radiates fluorescence light.

Furthermore, the present invention provides the above-mentioned color conversion filter wherein the above-mentioned squarylium dye is a compound represented by the following general formula (1), (2) or (3).

[Chemical Formula 1]

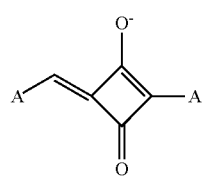

(1)

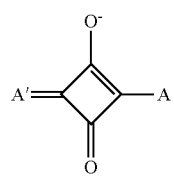

(2)

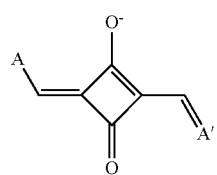
(3)
wherein A represents a group selected from (a) to (k) in the following Group I, and A' represents a group selected from (a') to (k') in the following Group II;
[Chemical Formula 2]
Group I
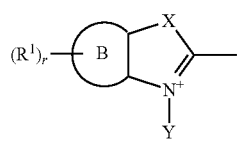 (a)
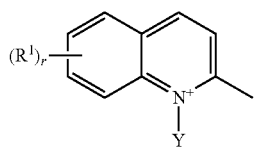 (b)
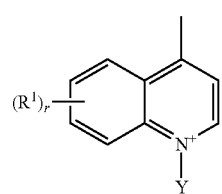 (c)
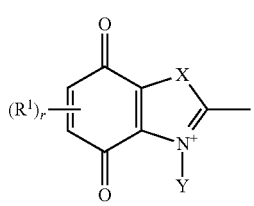 (d)
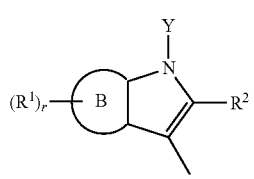 (e)
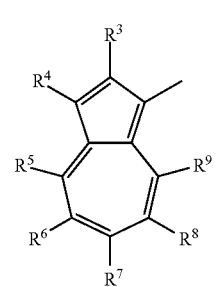 (f)
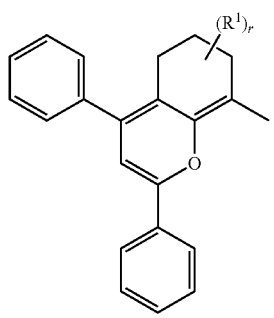 (g)
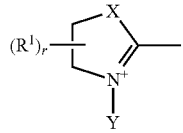 (h)
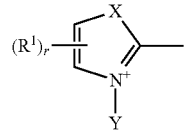 (i)
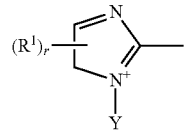 (j)
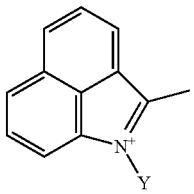 (k)
Group II
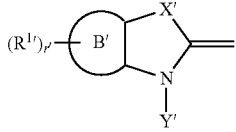 (a')
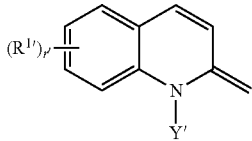 (b')
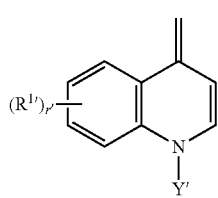 (c')

(d') 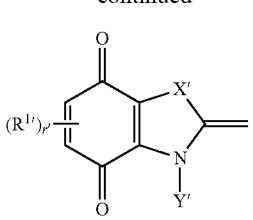

(e') 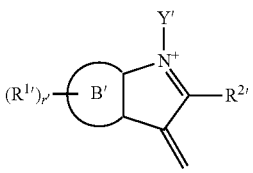

(f') 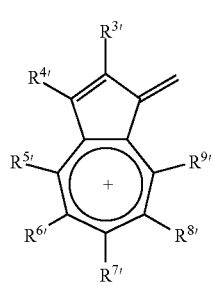

(g') 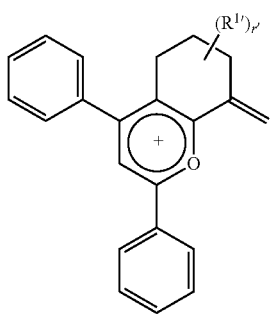

(h') 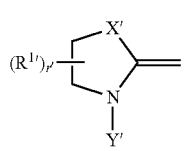

(i') 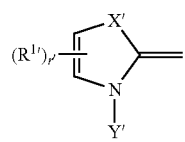

(j') 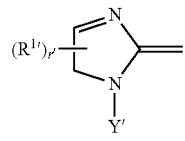

(k') 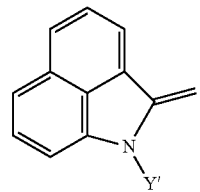

wherein ring B and ring B' each represents a benzene ring, a naphthalene ring, a phenanthrene ring or a pyridine ring, $R^1$ and $R^{1'}$ each represents a halogen atom, a nitro group, a cyano group, an aryl group having 6 to 30 carbon atoms, an arylalkyl group having 7 to 30 carbon atoms, an alkyl group having 1 to 8 carbon(s), a halogen-substituted alkyl group having 1 to 8 carbon atom(s), an alkoxy group having 1 to 8 carbon atom(s), a halogen-substituted alkoxy group having 1 to 8 carbon atom(s), or an ether group having 2 to 8 carbon atoms, $R^2$ and $R^{2'}$ each represents a hydrogen atom, a halogen atom, an aryl group having 6 to 30 carbon atoms, an arylalkyl group having 7 to 30 carbon atoms, or an alkyl group having 1 to 8 carbon atom(s), $R^3$ to $R^9$ and $R^{3'}$ to $R^{9'}$ each represents a hydrogen atom, a halogen atom, an alkyl group having 1 to 8 carbon atom(s), or a group that forms a condensed ring with the adjacent substituent, X and X' each represents an oxygen atom, a sulfur atom, a selenium atom, —$CR^{51}R^{52}$—, a cycloalkane-1,1-diyl group having 3 to 6 carbon atoms, —NH— or —$NY^2$—, $R^{51}$ and $R^{52}$ each represents an alkyl group having 1 to 20 carbon atom(s), an aryl group having 6 to 30 carbon atoms or an arylalkyl group having 7 to 30 carbon atoms, which is optionally substituted by a hydroxyl group, a halogen atom, a cyano group or a nitro group, or a hydrogen atom, Y, Y' and $Y^2$ each represents a hydrogen atom, or an alkyl group having 1 to 20 carbon atom(s), aryl group having 6 to 30 carbon atoms or an arylalkyl group having 7 to 30 carbon atoms, which is optionally substituted by a hydroxyl group, a halogen atom, a cyano group or a nitro group, wherein the methylene group in the alkyl group and arylalkyl group in the Y, Y' and $Y^2$ is optionally substituted by —O—, —S—, —CO—, —COO—, —OCO—, —SO$_2$—, —NH—, —CONH—, —NHCO—, —N=CH— or —CH=CH—, and r and r' each represents 0 or a number that can be substituted in (a) to (k) or (a') to (k').

Furthermore, the present invention provides a color conversion light-emitting device including a luminescent part and the above-mentioned color conversion filter.

In addition, the present invention provides the above-mentioned color conversion light-emitting device wherein the above-mentioned luminescent part is an LED element.

Furthermore, the present invention provides a photoelectric conversion device including a photoelectric conversion element and the above-mentioned color conversion filter.

Advantageous Effects of Invention

The color conversion filter of the present invention containing at least one kind of squarylium compound that radiates fluorescence light absorbs light in an unneeded wavelength region, radiates fluorescence light in a preferable wavelength region, and does not decrease brightness, and thus is preferable for color conversion light-emitting devices, photoelectric conversion devices and the like.

BRIEF DESCRIPTION OF DRAWINGS

FIG. 1 (b) is a cross-sectional drawing showing another preferable exemplary embodiment of the color conversion filter of the present invention.

FIG. 1 (c) is a cross-sectional drawing showing still another preferable exemplary embodiment of the color conversion filter of the present invention.

FIG. 2 (b) is a schematic cross-sectional drawing showing another preferable exemplary embodiment of a ballistic LED device that is an example of the color conversion light-emitting device using the color conversion filter of the present invention.

FIG. 2 (c) is a schematic cross-sectional drawing showing still another preferable exemplary embodiment of a ballistic LED device that is an example of the color conversion light-emitting device using the color conversion filter of the present invention.

FIG. 2 (d) is a cross-sectional drawing showing a preferable exemplary embodiment of a color conversion light-emitting device including rows of LED chips, which is an example of the color conversion light-emitting device using the color conversion filter of the present invention.

FIG. 2 (e) is a cross-sectional drawing showing another preferable exemplary embodiment of a color conversion light-emitting device including rows of LED chips, which is an example of the color conversion light-emitting device using the color conversion filter of the present invention.

FIG. 2 (f) is a cross-sectional drawing showing still another preferable exemplary embodiment of a color conversion light-emitting device including rows of LED chips, which is an example of the color conversion light-emitting device using the color conversion filter of the present invention.

DESCRIPTION OF EMBODIMENTS

Figure 1:
FIG. 1 (a) is a cross-sectional drawing showing a preferable exemplary embodiment of the color conversion filter of the present invention.
Figure 1:
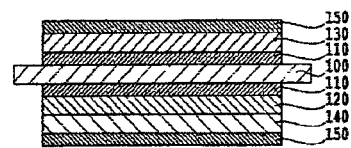
Figure 1:

Hereinafter the color conversion filter, color conversion light-emitting device and photoelectric conversion device of the present invention will be explained in detail based on preferable exemplary embodiments.

First, the squarylium compound used in the color conversion filter of the present invention will be explained.

Squarylium compounds have been used for optical filters and the like since before, but have been used only as an effect to absorb light at a specific wavelength. The present invention has first found that a squarylium compound radiates fluorescence light, and exerts a function to improve the qualities of color conversion light-emitting devices and photoelectric conversion devices by an effect that is different from the effect that has been known until now, by having a function to absorb light at a specific wavelength and radiate the light as fluorescence light to light at a preferable wavelength.

The color conversion filter of the present invention containing at least one kind of squarylium compound that radiates fluorescence light has a wavelength conversion capability and is preferable for use as a color conversion filter that has an absorption with a high intensity in the range of 570 to 600 nm and radiates fluorescence light with a high intensity in the range of 600 to 780 nm. Since visible ray is selectively absorbed and converted to visible ray with a longer wavelength, it is possible to obtain excellent color rendition without decreasing brightness.

Among the squarylium compounds that radiate fluorescence light, the compound represented by the above-mentioned general formula (1), (2) or (3) can be preferably used since it has a high fluorescence intensity.

In addition, as the two As in the above-mentioned general formula (1) and A and A' in the general formulas (2) and (3), one nonionic group and one cationic group are selected so that the compounds have neutral electrical charge.

In the above-mentioned general formulas (1), (2) and (3), examples of the halogen atom represented by $R^1$ and $R^{1\prime}$ may include fluorine, chlorine and iodine, examples of the aryl group having 6 to 30 carbon atoms may include phenyl, naphthyl, 2-methylphenyl, 3-methylphenyl, 4-methylphenyl, 4-vinylphenyl, 3-iso-propylphenyl, 4-iso-propylphenyl, 4-butylphenyl, 4-iso-butylphenyl, 4-tert-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di-tert-butylphenyl, 2,5-di-tert-butylphenyl, 2,6-di-tert-butylphenyl, 2,4-di-tert-pentylphenyl, 2,5-di-tert-amylphenyl, 2,5-di-tert-octylphenyl, 2,4-dicumylphenyl, 4-cyclohexylphenyl, (1,1'-biphenyl)-4-yl, 2,4,5-trimethylphenyl and the like, examples of the arylalkyl group having 7 to 30 carbon atoms may include benzyl, phenethyl, 2-phenylpropan-2-yl, diphenylmethyl, triphenylmethyl, styryl, cynnamyl, 2-(4'-isobutylphenyl)ethyl and the like, examples of the alkyl group having 1 to 8 carbon atom(s) may include methyl, ethyl, propyl, iso-propyl, butyl, sec-butyl, tert-butyl, iso-butyl, amyl, iso-amyl, tert-amyl, hexyl, 2-hexyl, 3-hexyl, cyclohexyl, 1-methylcyclohexyl, heptyl, 2-heptyl, 3-heptyl, iso-heptyl, tert-heptyl, 1-octyl, iso-octyl, tert-octyl and the like, examples of the halogen-substituted alkyl group having 1 to 8 carbon atom(s) may include alkyl groups in which at least one hydrogen atom is substituted by a halogen atom such as chloromethyl, dichloromethyl, trichloromethyl, fluoromethyl, difluoromethyl, trifluoromethyl and nonafluorobutyl, and the like, examples of the alkoxy group having 1 to 8 carbon atom(s) may include methyloxy, ethyloxy, iso-propyloxy, propyloxy, butyloxy, pentyloxy, iso-pentyloxy, hexyloxy, heptyloxy, octyloxy, 2-ethylhexyloxy and the like, examples of the halogen-substituted alkoxy group having 1 to 8 carbon atom(s) may include these alkoxy groups in which at least one hydrogen atom is substituted by a halogen atom such as chloromethyloxy, dichloromethyloxy, trichloromethyloxy, fluoromethyloxy, difluoromethyloxy, trifluoromethyloxy and nonafluorobutyloxy, and the like, examples of the ether group having 2 to 8 carbon atoms may include an alkoxyalkyl group having 2 to 8 carbon atoms and the like, and specific examples may include 2-methoxyethyl, 2-(2-methoxy)ethoxyethyl, 2-ethoxyethyl, 2-butoxyethyl, 4-methoxybutyl, 3-methoxybutyl and the like.

In the above-mentioned general formulas (1), (2) and (3), examples of the halogen atom, aryl group having 6 to 30 carbon atoms, arylalkyl group having 7 to 30 carbon atoms and alkyl group having 1 to 8 carbon atom(s) represented by $R^2$ and $R^{2\prime}$ may include the groups as exemplified in the above-mentioned explanation on R', and the like.

In the above-mentioned general formulas (1), (2) and (3), examples of the halogen atom and alkyl group having 1 to 8 carbon atom(s) represented by $R^3$ to $R^9$ and $R^{3\prime}$ to $R^{9\prime}$ may include the groups as exemplified in the above-mentioned explanation on R', and the like, and examples of the condensed ring that is constituted by the group that forms a condensed ring with the adjacent substituent may include aromatic rings such as a benzene ring, a naphthalene ring, a chlorobenzene ring, a bromobenzene ring, a methylbenzene ring, an ethylbenzene ring, a methoxybenzene ring and an ethoxybenzene ring; heterocycles such as an oxazole ring, a benzoxazole ring, an isoxazole ring, a naphthoxazole ring, an indolenine ring, a benzindolenine ring, a naphthoindolenine ring, an imidazole ring, a benzimidazole ring, a naphthimidazole ring, a furan ring, a benzofuran ring, a naphthofuran ring, a pyrrole ring, an indolidine ring, an indole ring, a quinoline ring, a quinoxaline ring, an imidazoquinoxaline ring, a thiazole ring, a benzothiazole ring and a naphthothiazole ring; and aliphatic rings such as a cyclopropane ring, a cyclobutane ring, a cyclopentane ring, a cyclohexane ring, a cycloheptane ring and a cyclooctane ring.

In the above-mentioned general formula (1), (2) and (3), examples of the cycloalkane-1,1-diyl group having 3 to 6 carbon atoms represented by X and X' may include cyclopropane-1,1-diyl, cyclobutane-1,1-diyl, 2,4-dimethylcyclobutane-1,1-diyl, 3,3-dimethylcyclobutane-1,1-diyl, cyclopentane-1,1-diyl, cyclohexane-1,1-diyl and the like, examples of the alkyl group having 1 to 20 carbon atom(s) represented by $R^{51}$ and $R^{52}$ in X and X' may include methyl, ethyl, propyl, iso-propyl, butyl, sec-butyl, tert-butyl, iso-butyl, amyl, iso-amyl, tert-amyl, hexyl, 2-hexyl, 3-hexyl, cyclohexyl, 1-methylcyclohexyl, heptyl, 2-heptyl, 3-heptyl, iso-heptyl, tert-heptyl, 1-octyl, iso-octyl, tert-octyl, 2-ethylhexyl, nonyl, iso-nonyl, decyl, dodecyl, tridecyl, tetradecyl, pentadecyl, hexadecyl, heptadecyl, octadecyl and the like, and the hydrogen atoms in these alkyl groups may be substituted at an optional number by a hydroxyl group, a halogen atom, a cyano group or a nitro group.

In the above-mentioned general formulas (1), (2) and (3), examples of the aryl group having 6 to 30 carbon atoms represented by $R^{51}$ and $R^{52}$ may include the groups as exemplified in the above-mentioned explanation on R', and the hydrogen atoms in these aryl groups may be substituted at an optional number by a hydroxyl group, a halogen atom, a cyano group or a nitro group.

In the above-mentioned general formulas (1), (2) and (3), examples of the arylalkyl group having 7 to 30 carbon atoms represented by $R^{51}$ and $R^{52}$, may include the groups as exemplified in the above-mentioned explanation on R', and the hydrogen atoms in these arylalkyl groups may be substituted at an optional number by a hydroxyl group, a halogen atom, a cyano group or a nitro group.

In the above-mentioned general formulas (1), (2) and (3), examples of the alkyl group having 1 to 20 carbon atom(s) which is optionally substituted by a hydroxyl group, a halogen atom, a cyano group or a nitro group; the aryl group having 6 to 30 carbon atoms which is optionally substituted by a hydroxyl group, a halogen atom, a cyano group or a nitro group; or the arylalkyl group having 7 to 30 carbon atoms which is optionally substituted by a hydroxyl group, a halogen atom, a cyano group or a nitro group, which is represented by Y, Y' and $Y^2$, may include the groups as exemplified in the above-mentioned explanation on $R^{51}$ and $R^{52}$, and the methylene group in the alkyl group, aryl group and arylalkyl group in these Y, Y' and $Y^2$ is optionally substituted by —O—, —S—, —CO—, —COO—, —OCO—, —SO$_2$—, —NH—, —CONH—, —NHCO—, —N=CH— or —CH=CH—. Examples may include alkyl groups such as methyl, ethyl, propyl, iso-propyl, butyl, sec-butyl, tert-butyl, iso-butyl, amyl, iso-amyl, tert-amyl, hexyl, 2-hexyl, 3-hexyl, cyclohexyl, 1-methylcyclohexyl, heptyl, 2-heptyl, 3-heptyl, iso-heptyl, tert-heptyl, 1-octyl, iso-octyl, tert-octyl, 2-ethylhexyl, nonyl, iso-nonyl, decyl, dodecyl, tridecyl, tetradecyl, pentadecyl, hexadecyl, heptadecyl and octadecyl; aryl groups such as phenyl, naphthyl, 2-methylphenyl, 3-methylphenyl, 4-methylphenyl, 4-vinylphenyl, 3-iso-propylphenyl, 4-iso-propylphenyl, 4-butylphenyl, 4-iso-butylphenyl, 4-tert-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di-tert-butylphenyl and cyclohexylphenyl; arylalkyl groups such as benzyl, phenethyl, 2-phenylpropan-2-yl, diphenylmethyl, triphenylmethyl, styryl, cynnamyl and 2-(4'-isobutylphenyl)ethyl, and the like, which are substituted by an ether bond, a thioether bond or the like, such as 2-methoxyethyl, 3-methoxypropyl, 4-methoxybutyl, 2-butoxyethyl, methoxyethoxyethyl, methoxyethoxyethoxyethyl, 3-methoxybutyl, 2-phenoxyethyl, 3-phenoxypropyl, 2-methylthioethyl, 2-phenylthioethyl and 2-(4'-isopropoxyphenyl)ethyl.

Among the compounds represented by the above-mentioned general formula (1), (2) or (3) of the present invention, compounds wherein A in the general formula represents a group selected from (a), (b) or (e) in the above-mentioned Group I and A' represents a group selected from (a'), (b') or (e') in the above-mentioned Group II are further preferable since they have a preferable wavelength property. Furthermore, compounds wherein the two As in the above-mentioned general formula (1) are both represented by (a) in the above-mentioned Group I or compounds wherein the two As are both represented by (e) in the above-mentioned Group I; compounds wherein A and A' in the above-mentioned general formula (2) or (3) are represented by (a) in the above-mentioned Group I and by (a') in Group II, or compounds wherein A and A' are represented by (e) in the above-mentioned Group I and (e') in the above-mentioned Group II are specifically preferable since they are easily produced.

Furthermore, the following groups are preferable for (a) to (k) in the above-mentioned Group I and (a') to (k') in the above-mentioned Group II.

Y and Y' are each preferably an alkyl group having 1 to 20 (specifically 1 to 10) carbon atom(s), an aryl group having 6 to 30 (specifically 6 to 10) carbon atoms or an arylalkyl group having 7 to 30 (specifically 7 to 15) carbon atoms, which is optionally substituted by a hydroxyl group, a halogen atom, a cyano group or a nitro group.

The ring B and ring B' are each preferably a benzene ring.

r is preferably 0 to 2. In the case when r is 1 or more, $R^1$ is preferably a halogen atom, or an alkyl group, halogen-substituted alkyl group, alkoxy group or halogen-substituted alkoxy group having 1 to 8 (specifically 1 to 4) carbon atom(s).

$R^2$ and $R^{2'}$ are each preferably a hydrogen atom, an alkyl group having 1 to 8 (specifically 1 to 4) carbon atom(s), or an aryl group having 6 to 30 (specifically 6 to 10) carbon atoms.

X and X' are each preferably an oxygen atom, a sulfur atom, —$CR^{51}R^{52}$— (specifically, those in which $R^{51}$ and $R^{52}$ are each an alkyl group having 1 to 8 carbon atom(s) which is optionally substituted by a hydroxyl group, a halogen atom, a cyano group or a nitro group), or a cycloalkane-1,1-diyl group having 3 to 6 carbon atoms.

Specific examples of the squarylium compound represented by the above-mentioned general formula (1), (2) or (3) of the present invention may include compounds Nos. 1 to 74, compounds Nos. 101 to 124 and compounds Nos. 201 to 242 mentioned below, but is not limited to these compounds. Compounds Nos. 1 to 75 are specific examples of the above-mentioned general formula (1), compounds Nos. 101 to 124 are specific examples of the above-mentioned general formula (2), and compounds Nos. 201 to 242 are specific examples of the above-mentioned general formula (3).
[Chemical Formula 3-A]
Compound No. 1
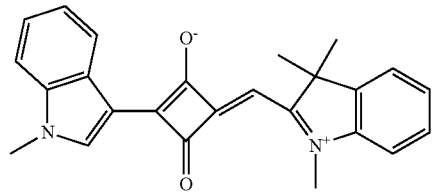
Compound No. 2
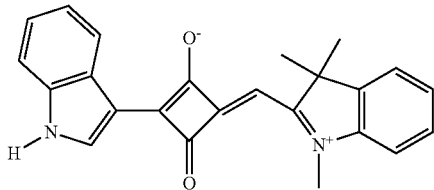
Compound No. 3
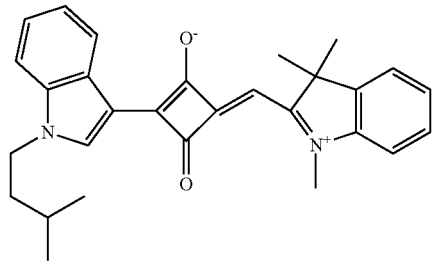
Compound No. 4
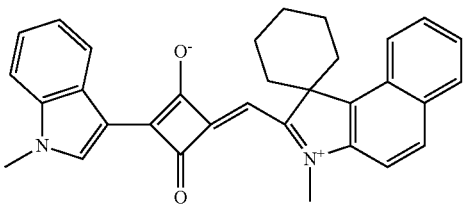
Compound No. 5
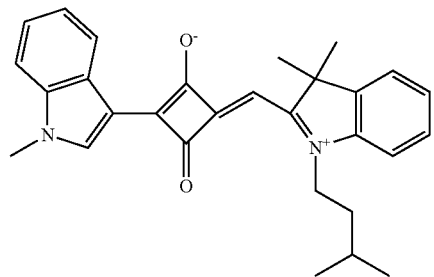
Compound No. 6
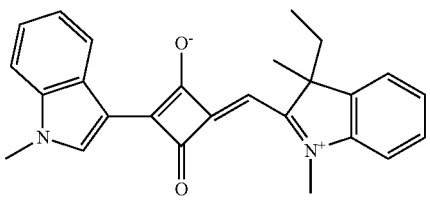
Compound No. 7
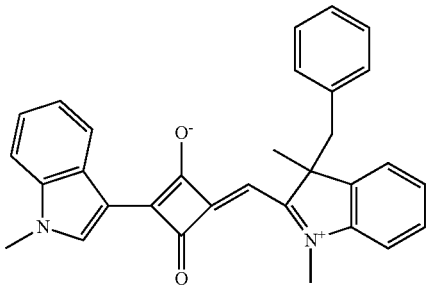
Compound No. 8
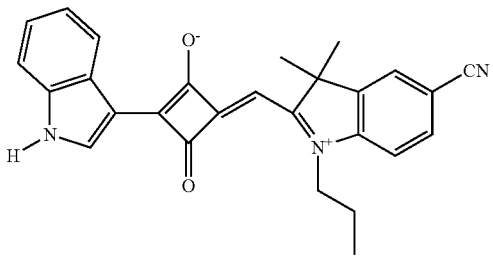
Compound No. 9
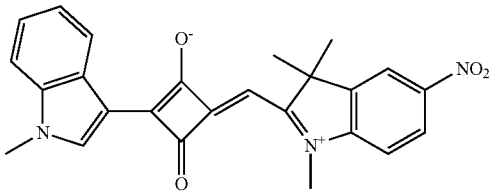
Compound No. 10
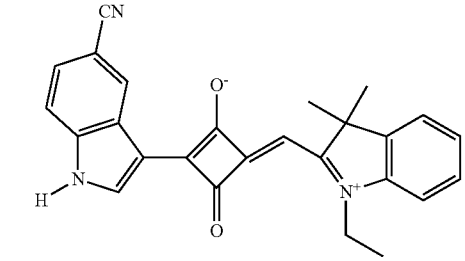
Compound No. 11
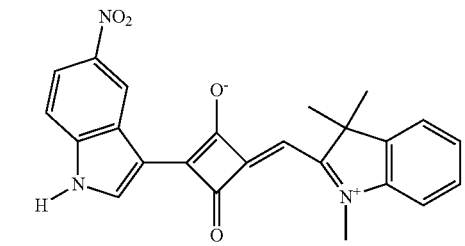

Compound No. 12
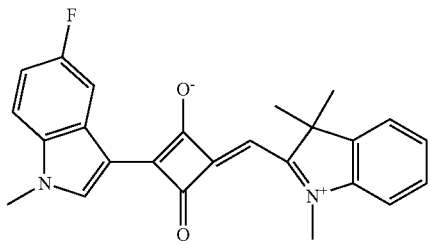
[Chemical Formula 3-B]
Compound No. 13
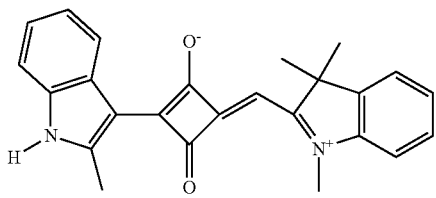
Compound No. 14
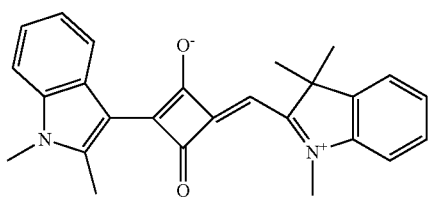
Compound No. 15
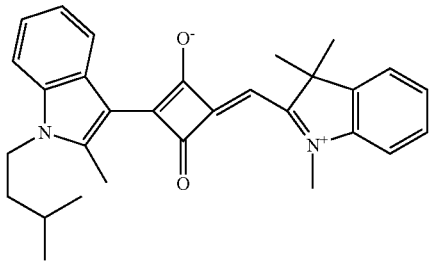
Compound No. 16
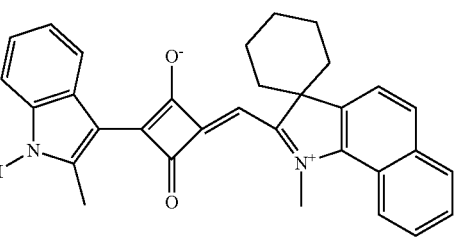
Compound No. 17
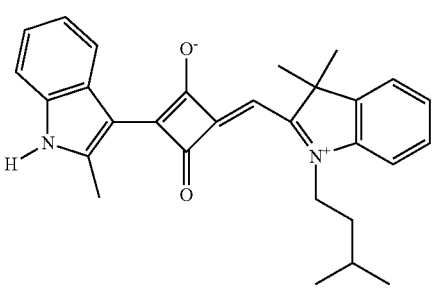
Compound No. 18
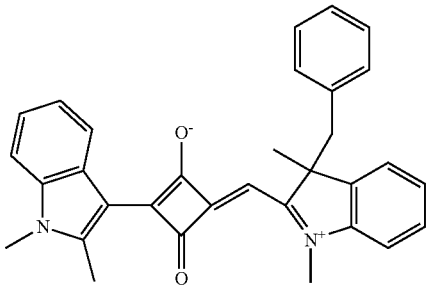
Compound No. 19
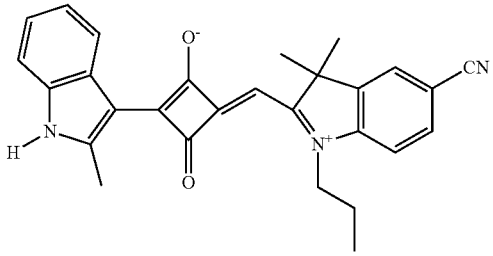
Compound No. 20
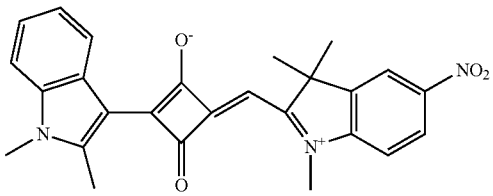
Compound No. 21
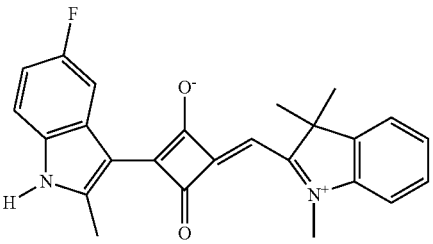
Compound No. 22
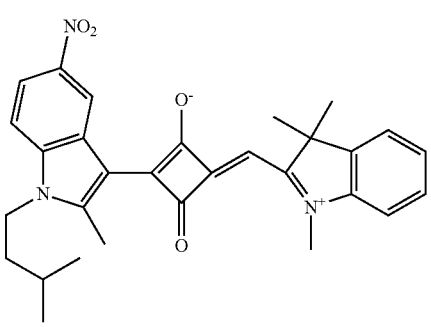
Compound No. 23

Compound No. 24
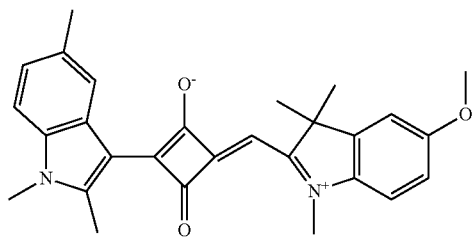
Compound No. 25
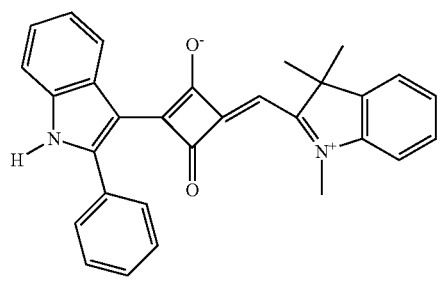
Compound No. 26
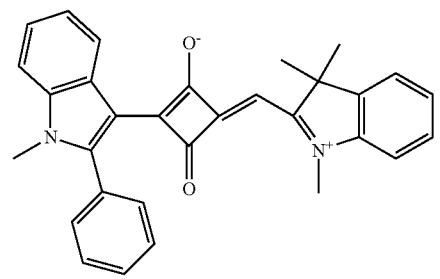
Compound No. 27
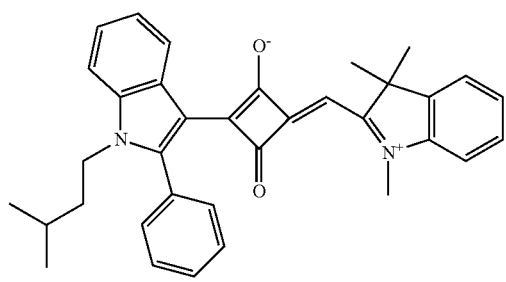
Compound No. 28
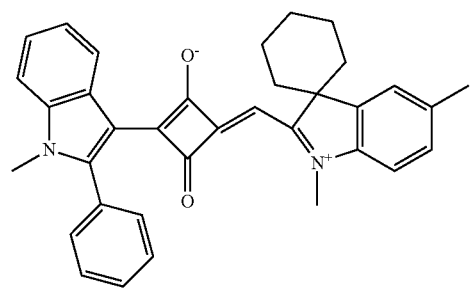
Compound No. 29
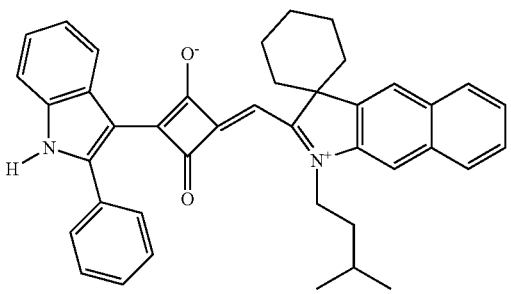
Compound No. 30
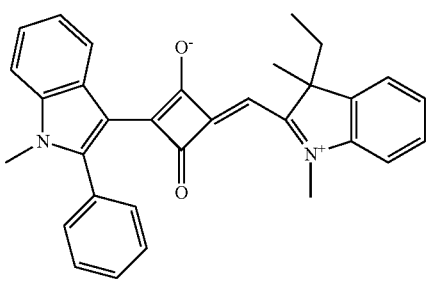
[Chemical Formula 3-C]
Compound No. 31
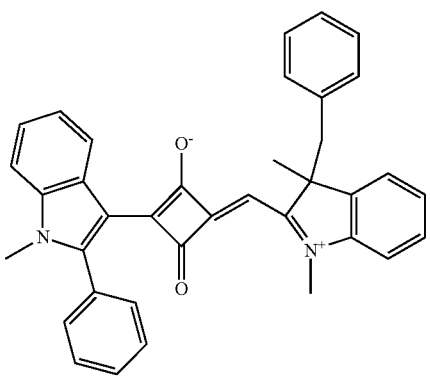
Compound No. 32
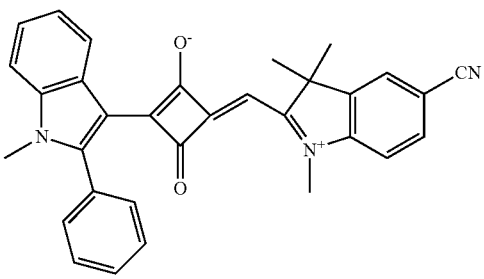
Compound No. 33
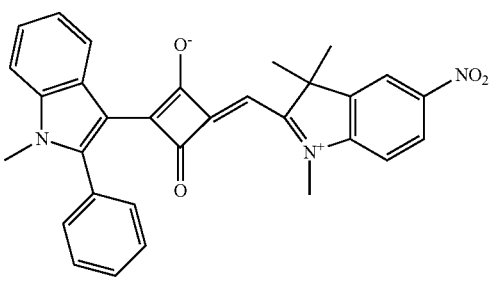

Compound No. 34
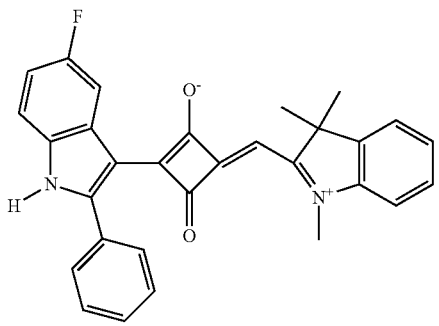
Compound No. 35
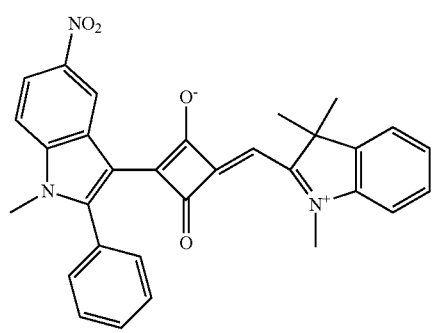
Compound No. 36
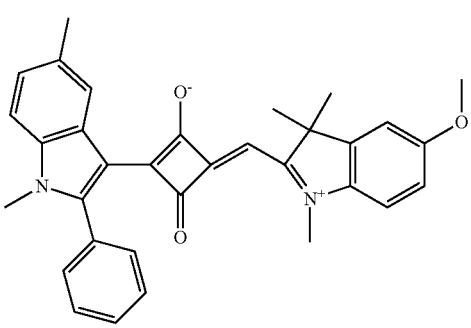
Compound No. 37
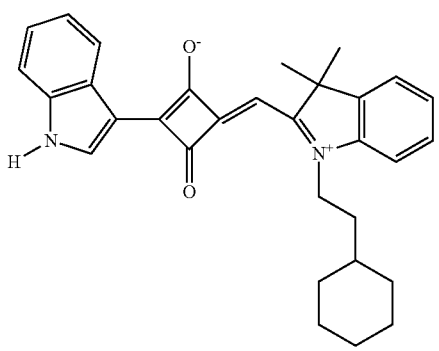
Compound No. 38
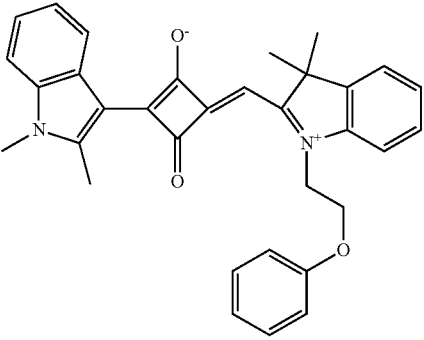
Compound No. 39
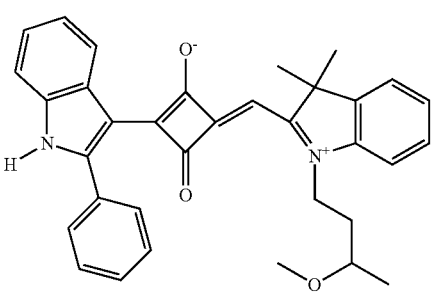
Compound No. 40
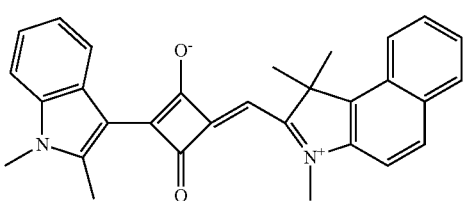
Compound No. 41
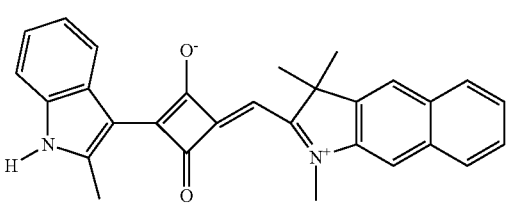
Compound No. 42
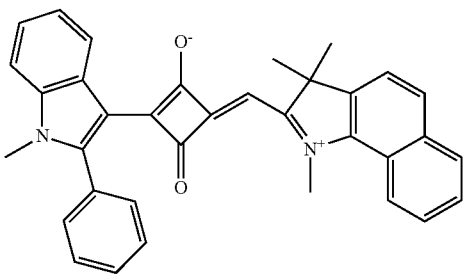

Compound No. 43
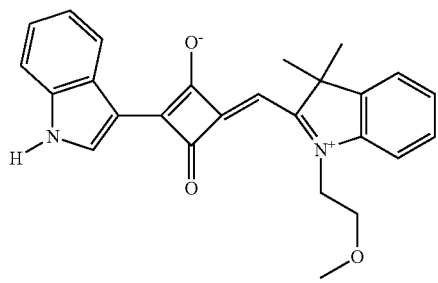
Compound No. 44
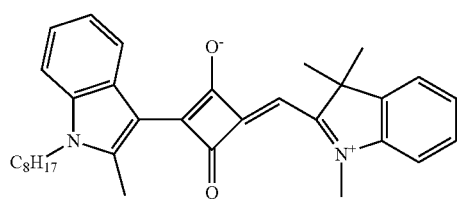
Compound No. 45
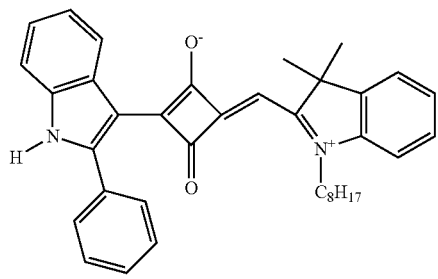
[Chemical Formula 3-D]
Compound No. 46
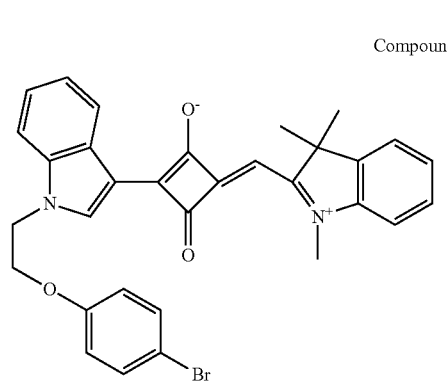
Compound No. 47
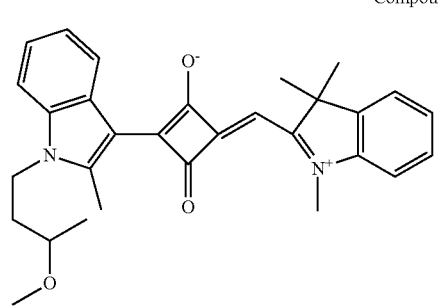
Compound No. 48
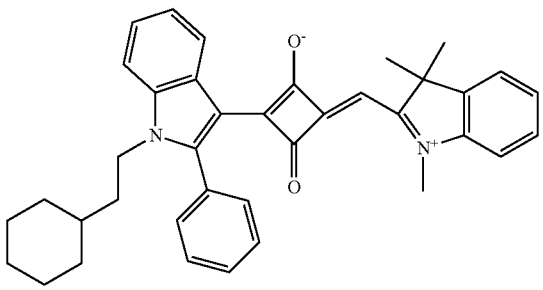
Compound No. 49
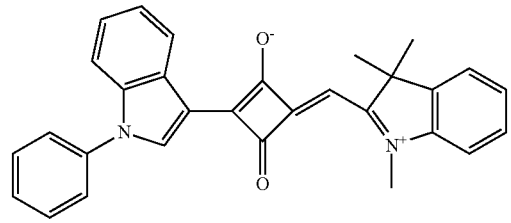
Compound No. 50
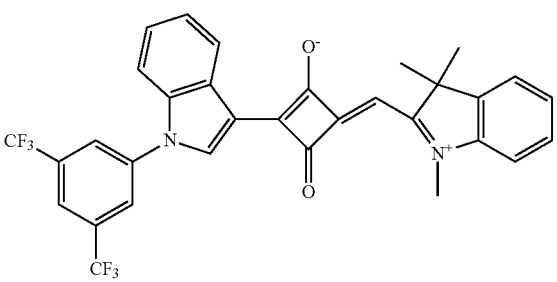
Compound No. 51
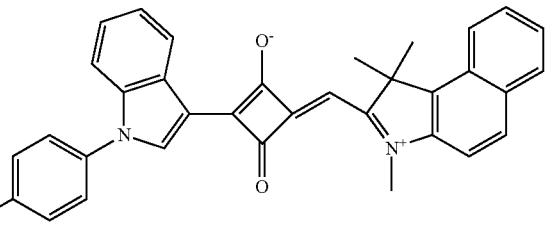
Compound No. 52
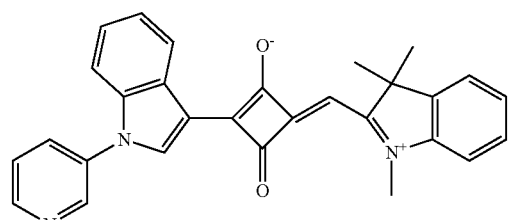
Compound No. 53
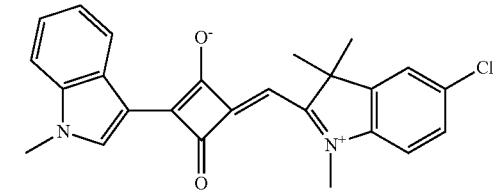

Compound No. 54
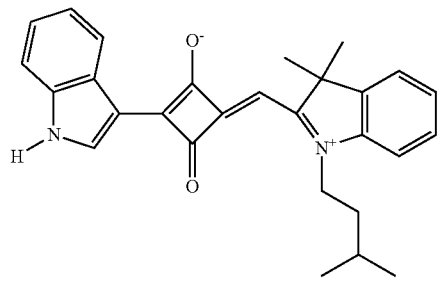
Compound No. 55
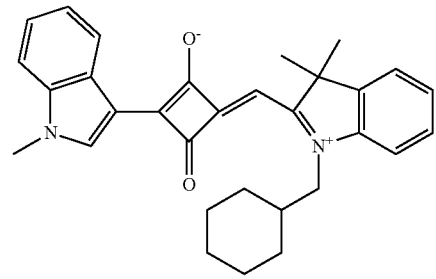
Compound No. 56
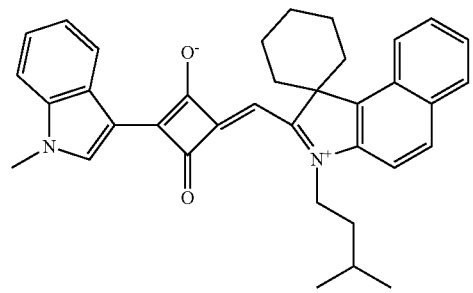
Compound No. 57
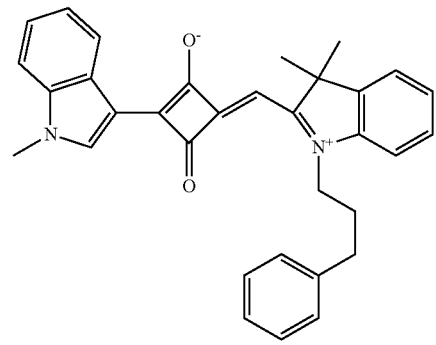
Compound No. 58
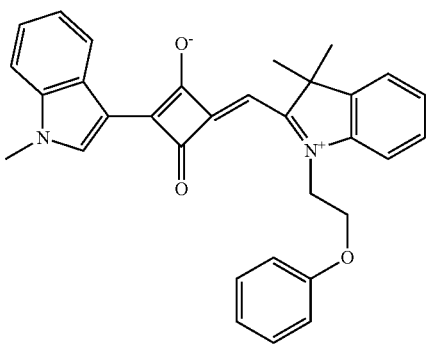
Compound No. 59
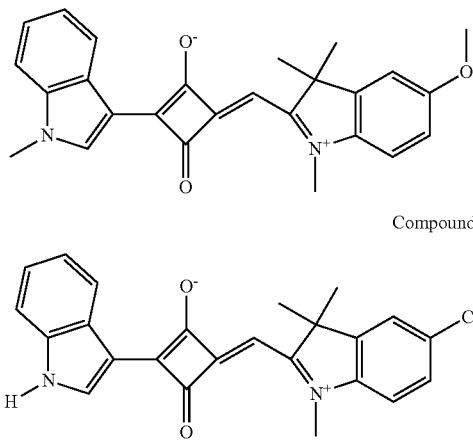
Compound No. 60
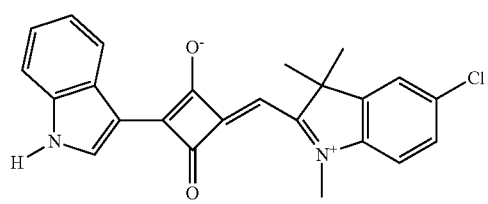
Compound No. 61
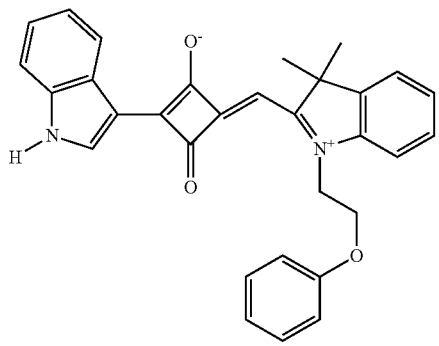
[Chemical Formula 3-E]
Compound No. 62

Compound No. 63
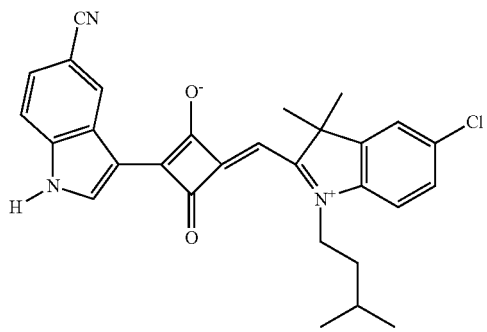
Compound No. 64
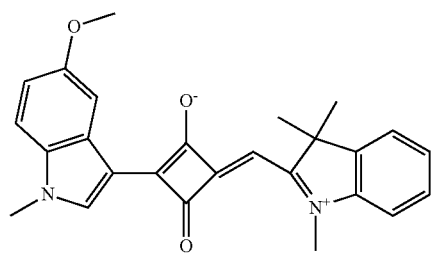
Compound No. 65
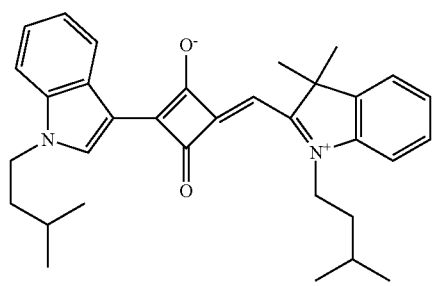
Compound No. 66
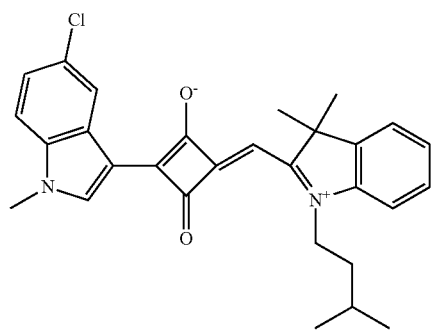
Compound No. 67
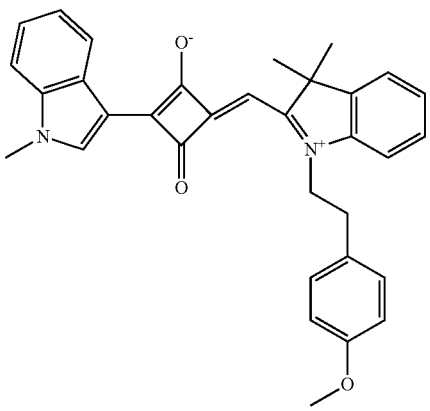
Compound No. 68
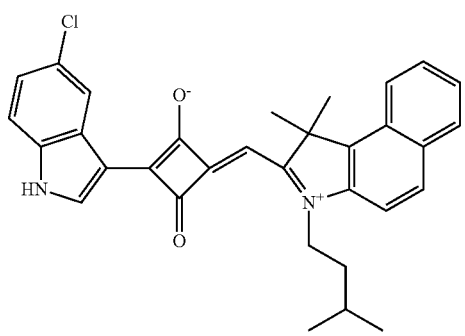
Compound No. 69
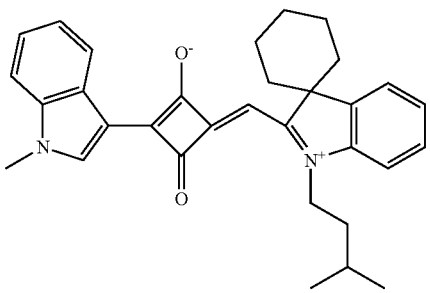
Compound No. 70
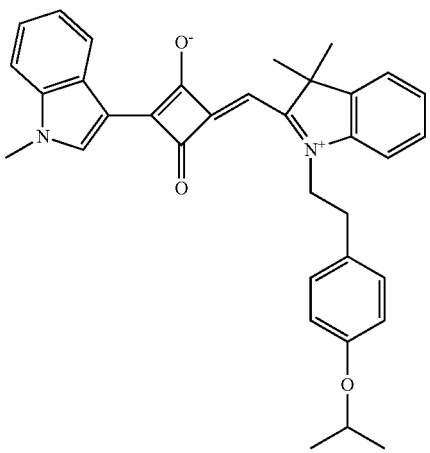

Compound No. 71
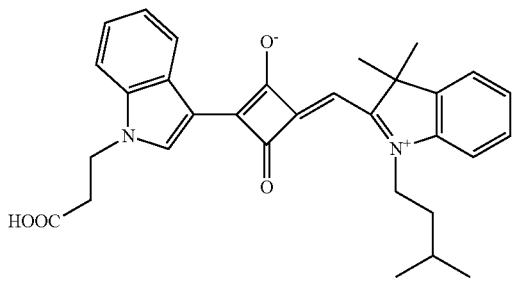
Compound No. 72
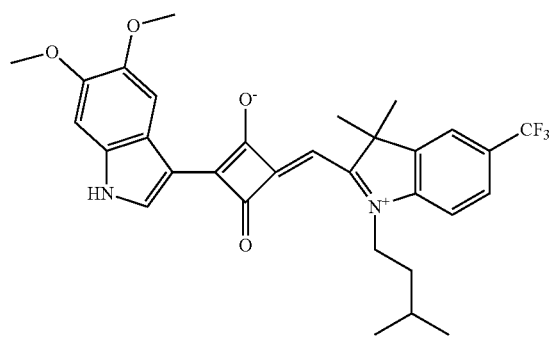
Compound No. 73
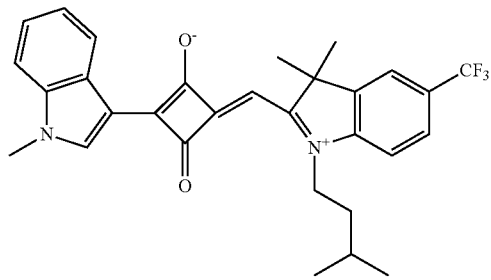
Compound No. 74
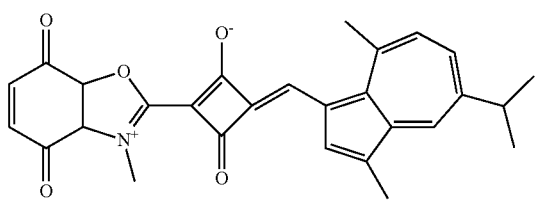
[Chemical Formula 3-F]
Compound No. 101
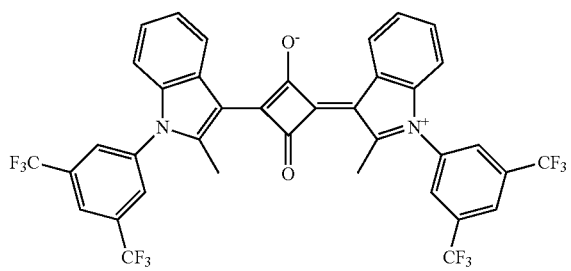
Compound No. 102
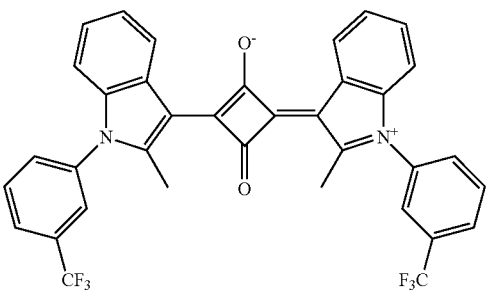
Compound No. 103
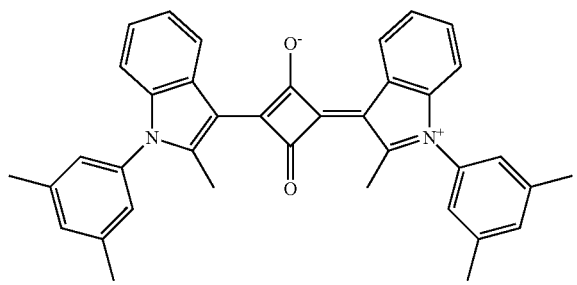
Compound No. 104
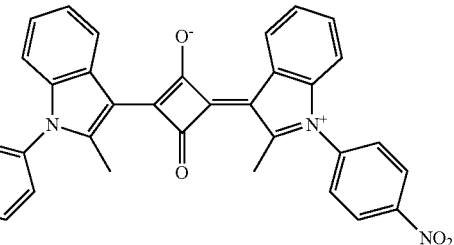
Compound No. 105
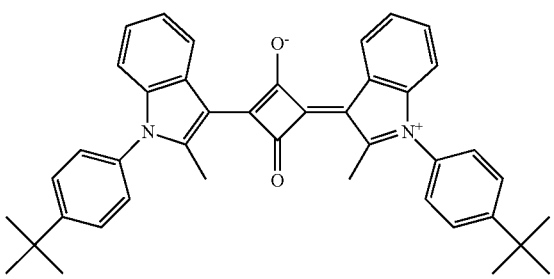
Compound No. 106
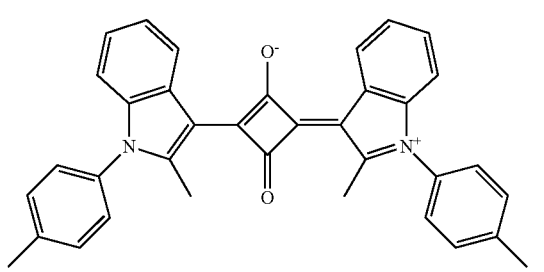

Compound No. 107
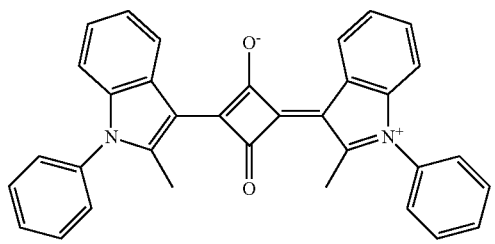
Compound No. 108
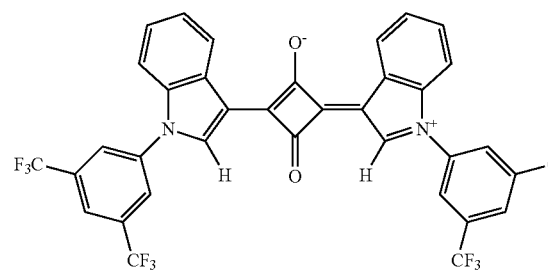
[Chemical Formula 3-G]
Compound No. 109
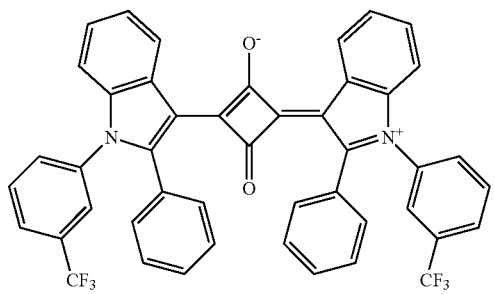
Compound No. 110
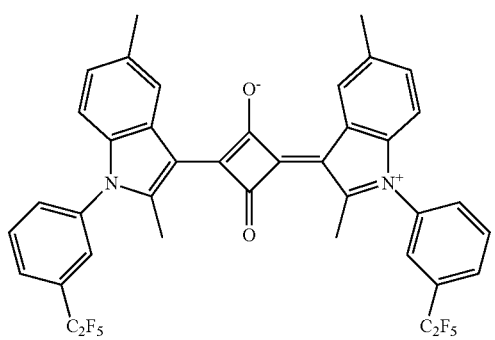
Compound No. 111
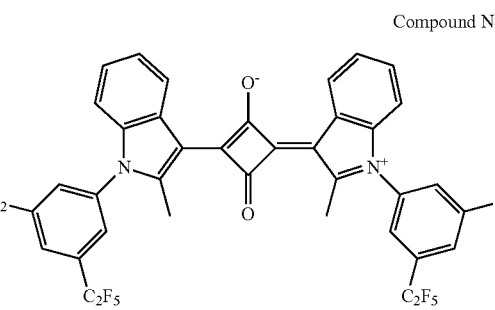
Compound No. 112
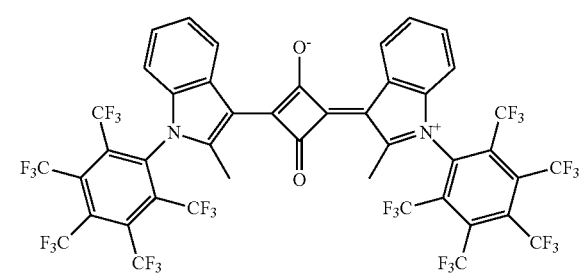
Compound No. 113
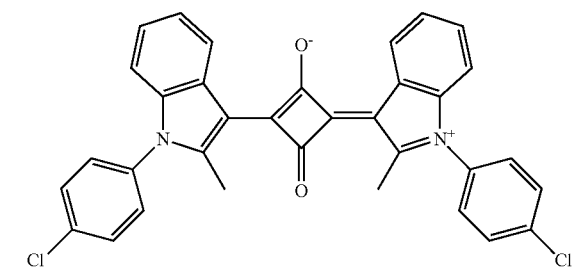
Compound No. 114
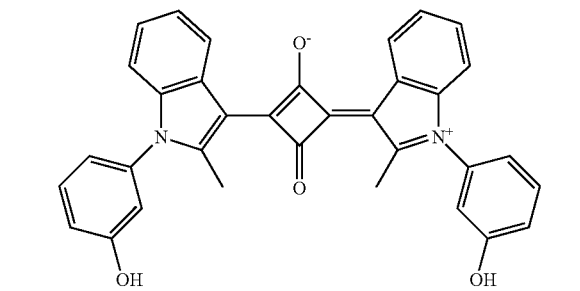
Compound No. 115
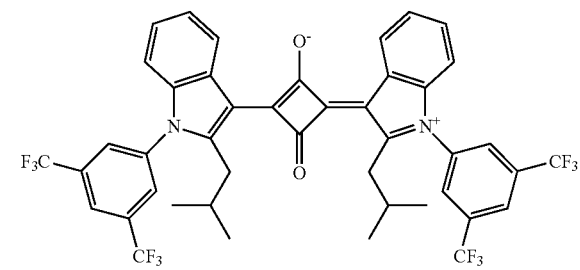
Compound No. 116
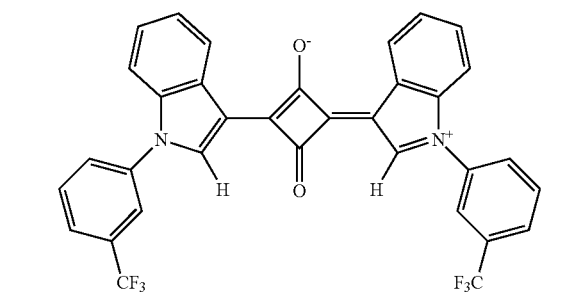

Compound No. 117
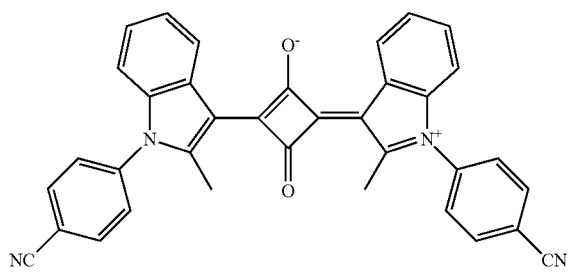
Compound No. 118
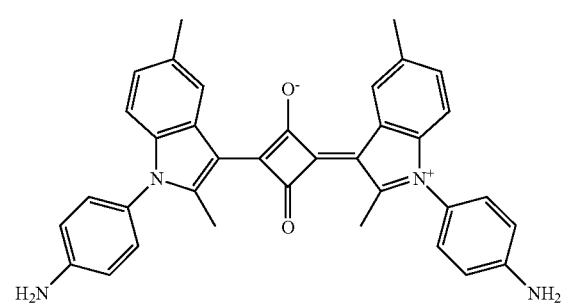
Compound No. 119
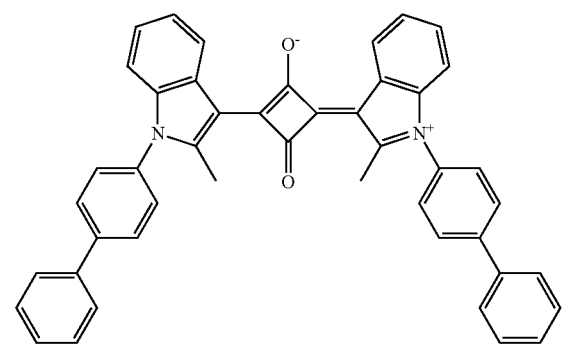
Compound No. 120
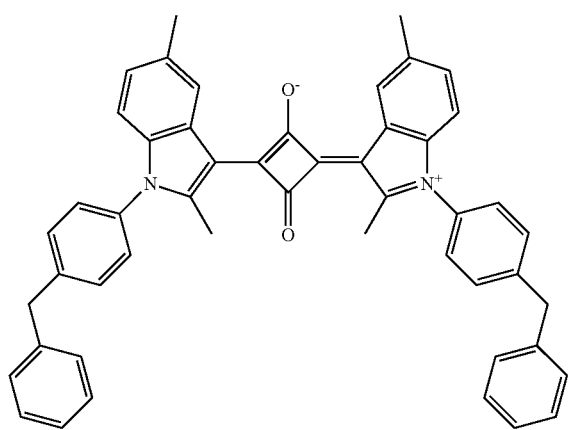
[Chemical Formula 3-H]
Compound No. 121
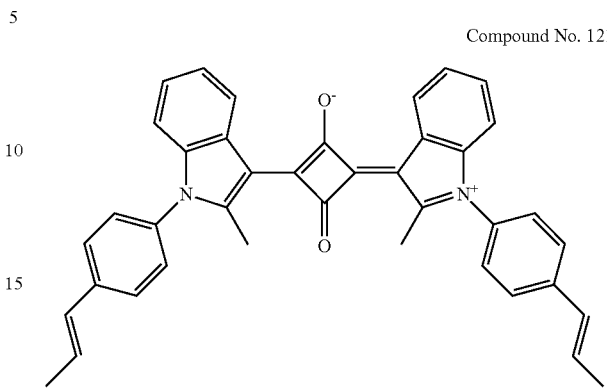
Compound No. 122
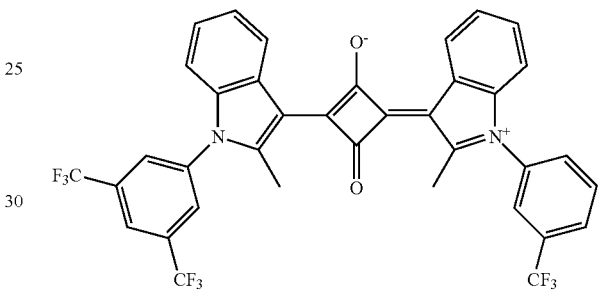
Compound No. 123
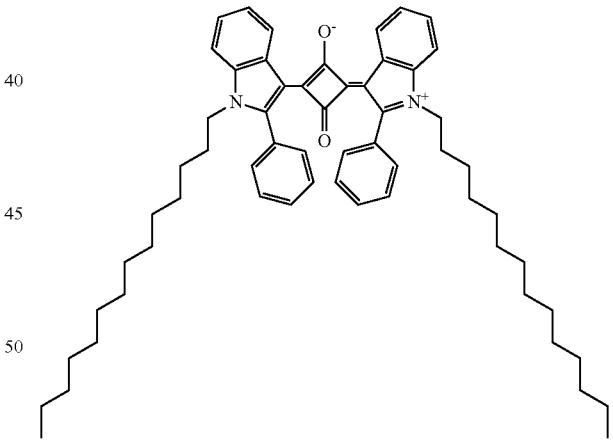
Compound No. 124
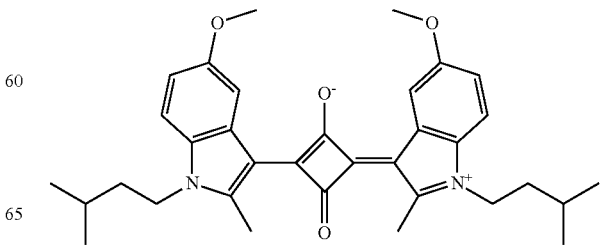

[Chemical Formula 3-I]
Compound No. 201
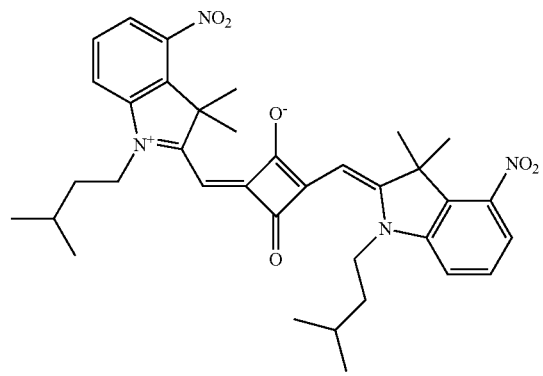
Compound No. 202
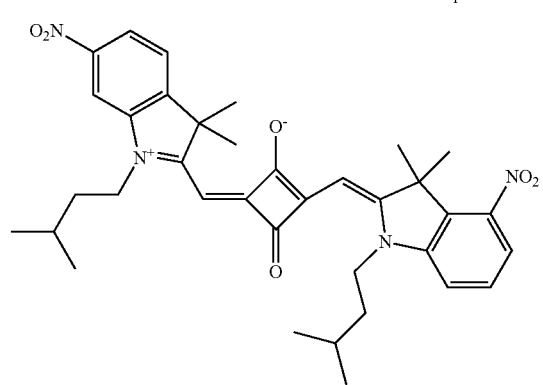
Compound No. 203
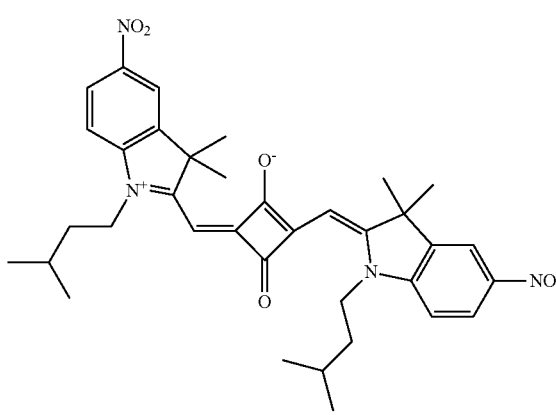
Compound No. 204
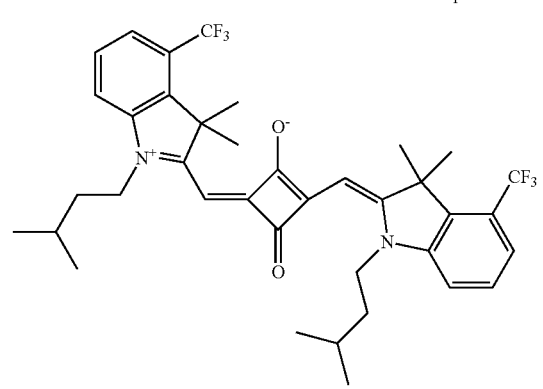
Compound No. 205
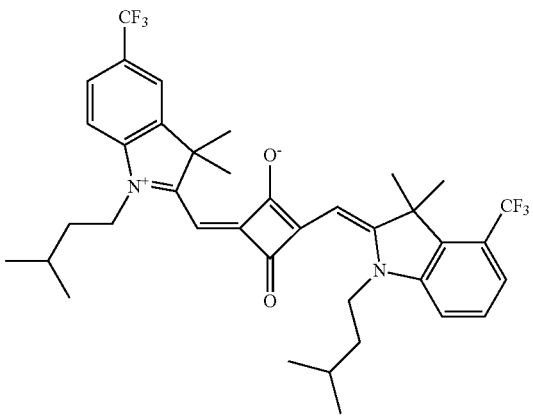
Compound No. 206
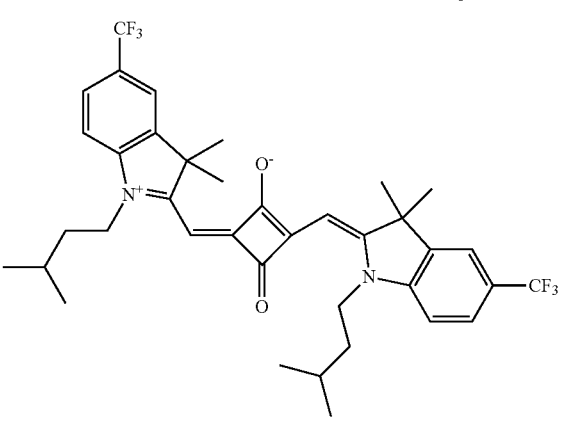
Compound No. 207
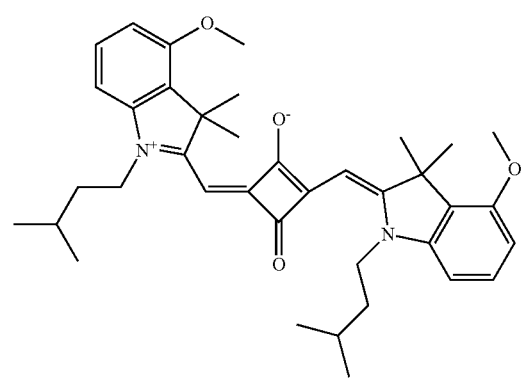

-continued
Compound No. 208
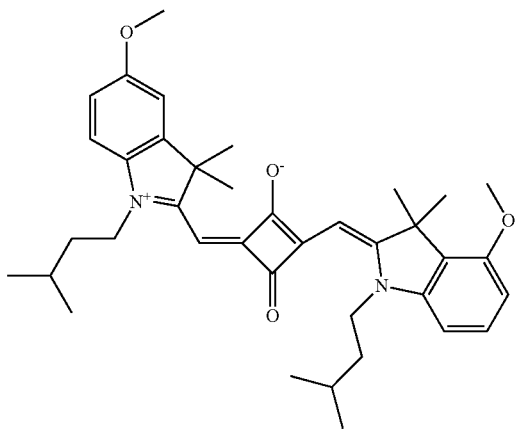
[Chemical Formula 3-J]
Compound No. 209
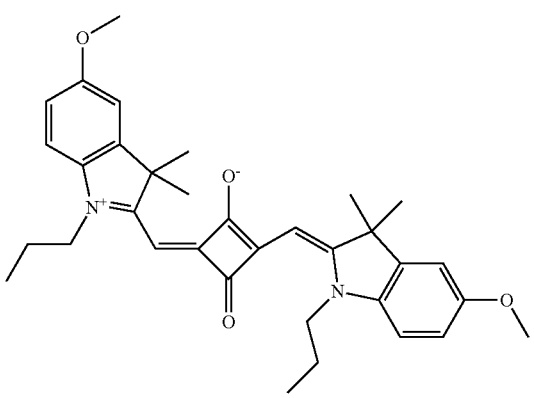
Compound No. 210
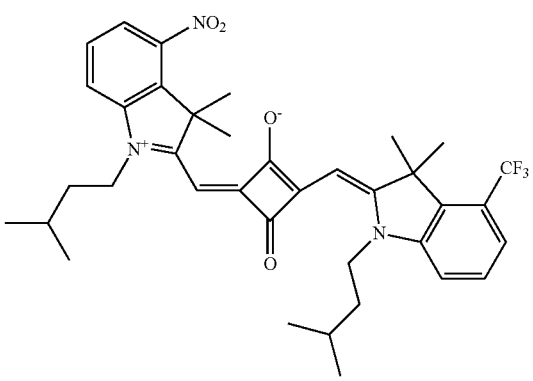
-continued
Compound No. 211
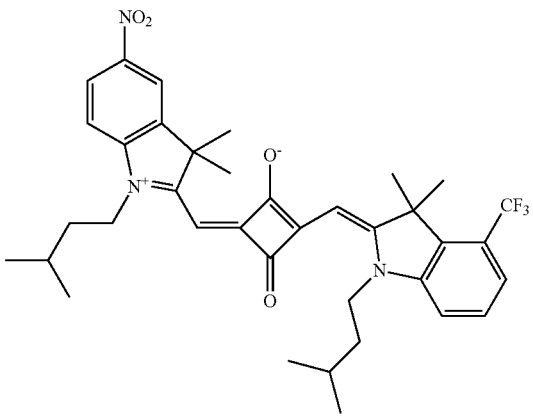
Compound No. 212
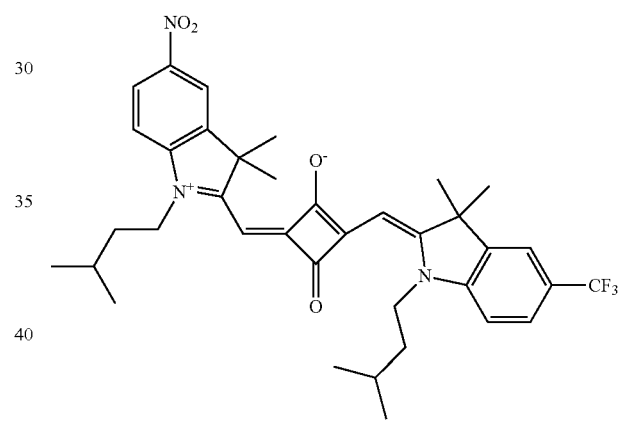
Compound No. 213
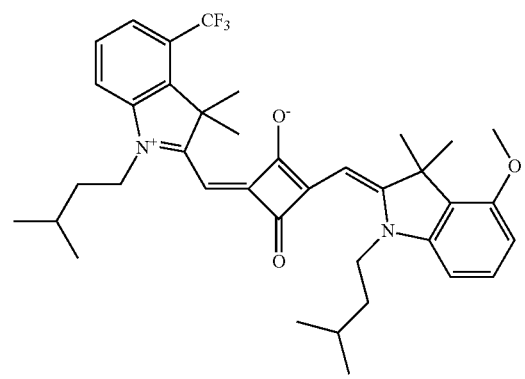

Compound No. 214
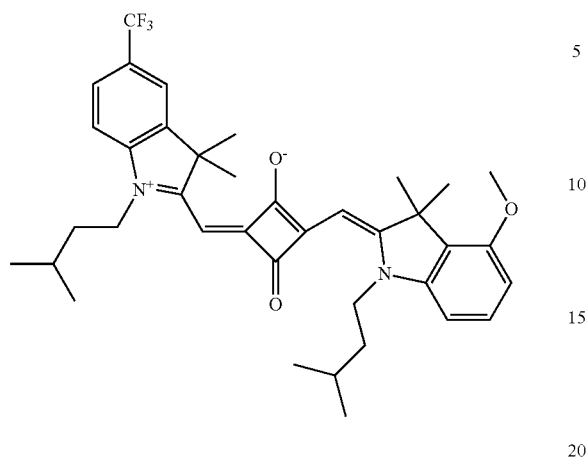
Compound No. 215
Compound No. 216
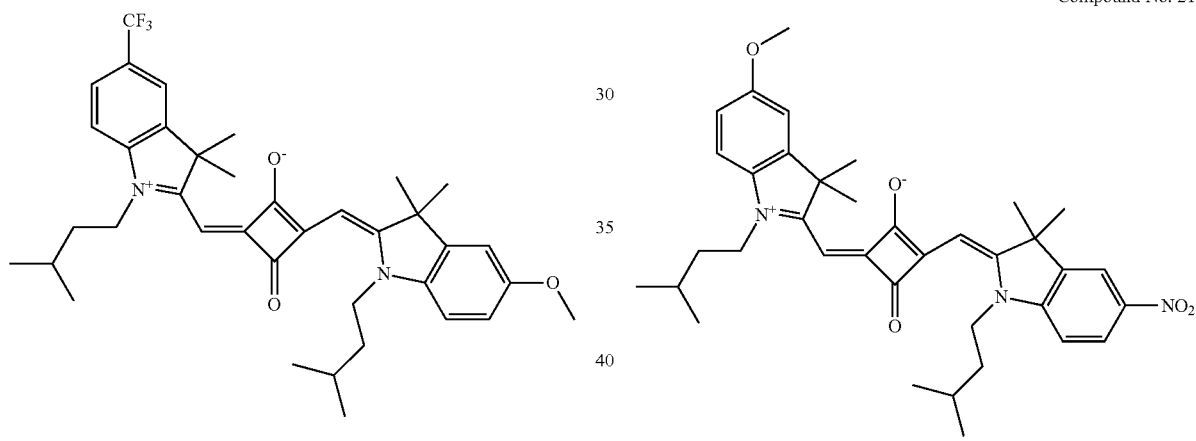
Compound No. 217
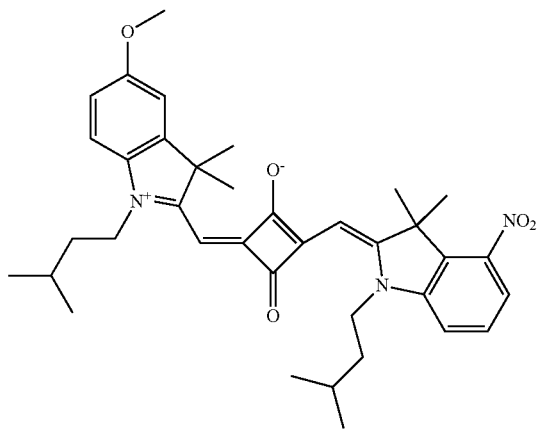
Compound No. 218
[Chemical Formula 3-K]
Compound No. 219
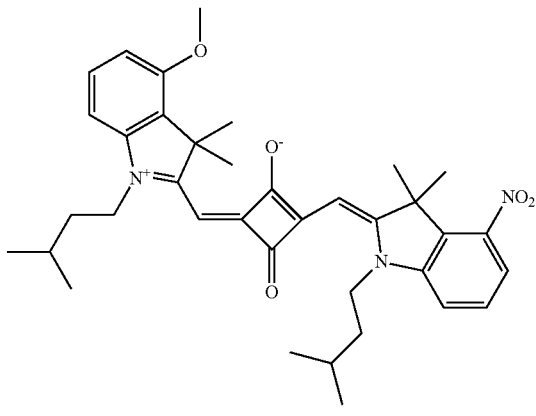
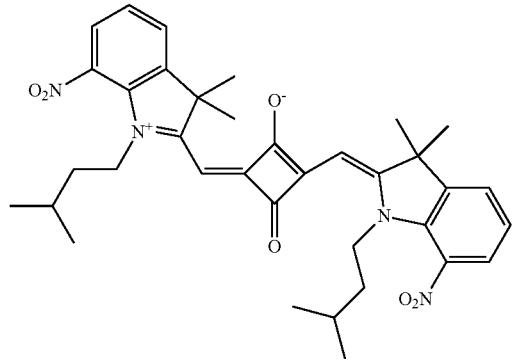

Compound No. 220
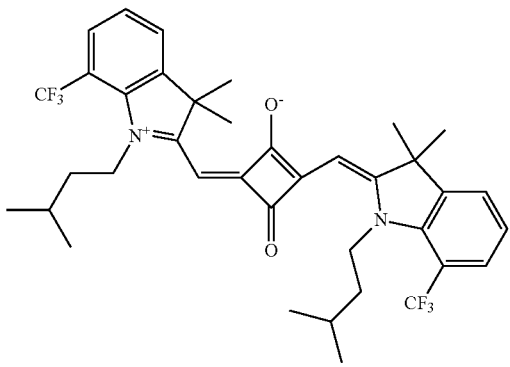
Compound No. 221
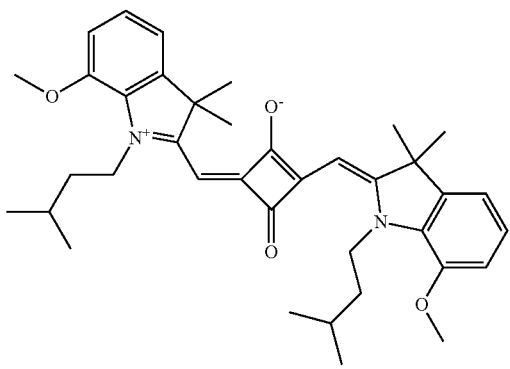
Compound No. 222
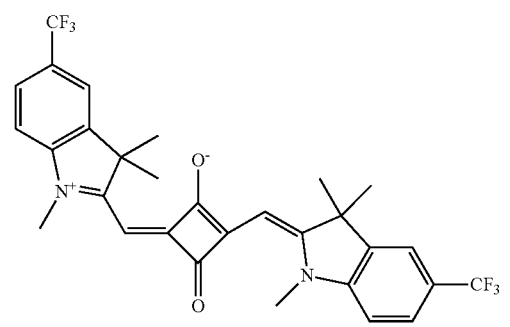
Compound No. 223
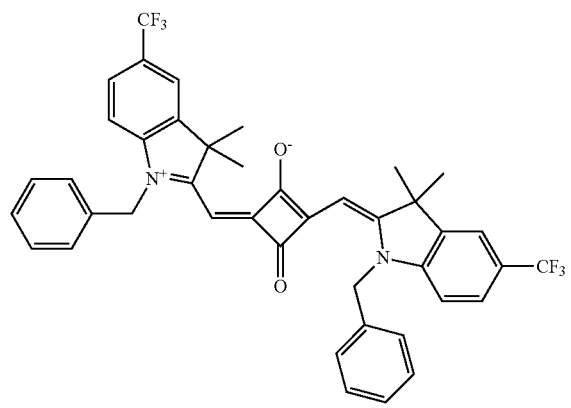
Compound No. 224
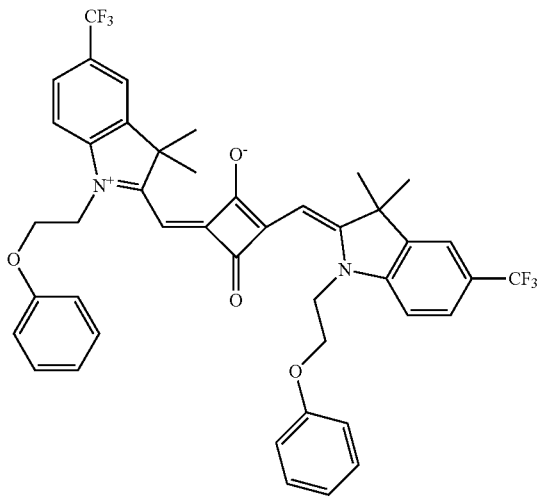
Compound No. 225
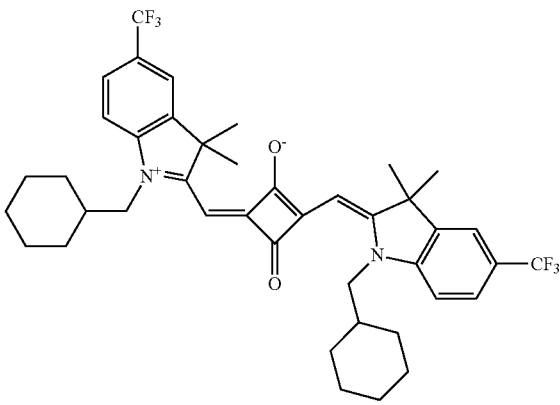
Compound No. 226
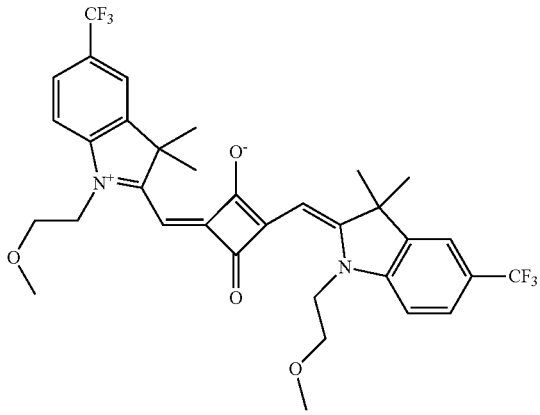

[Chemical Formula 3-L]
Compound No. 227
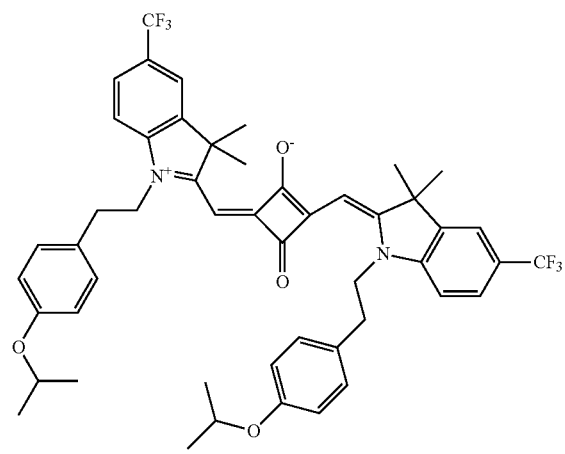
Compound No. 228
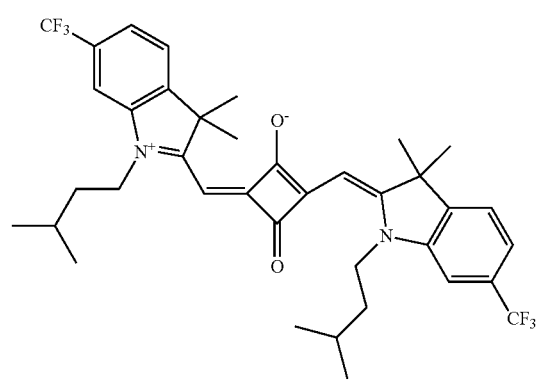
Compound No. 229
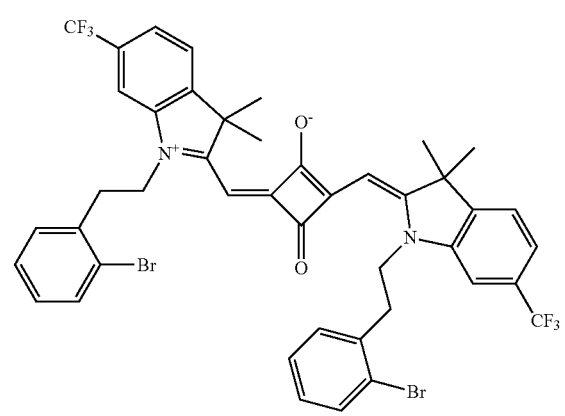
Compound No. 230
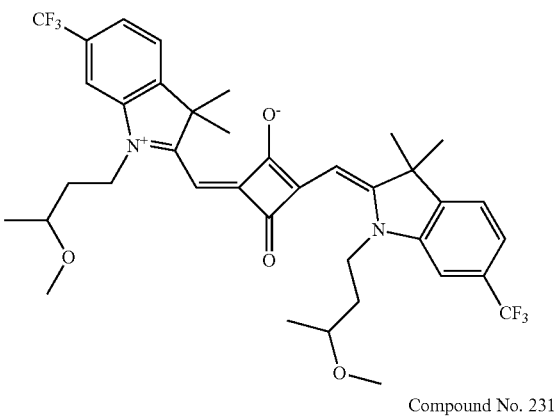
Compound No. 231
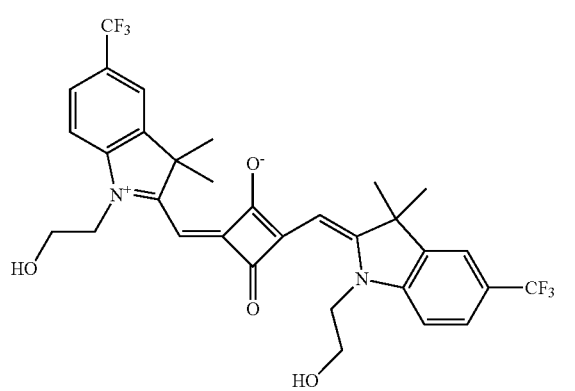
Compound No. 232
Compound No. 233
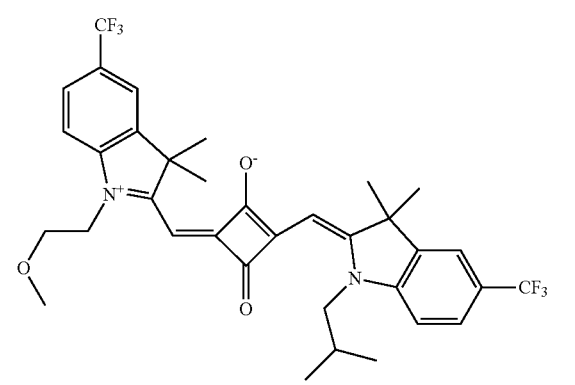

Compound No. 234
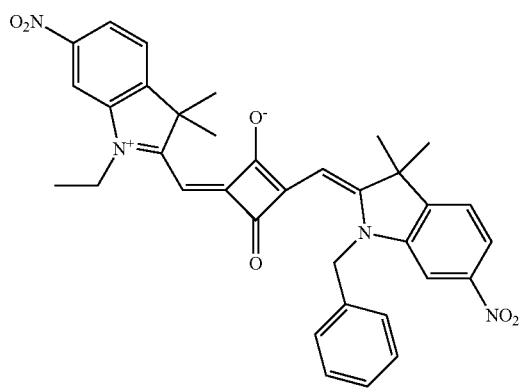
[Chemical Formula 3-M]
Compound No. 235
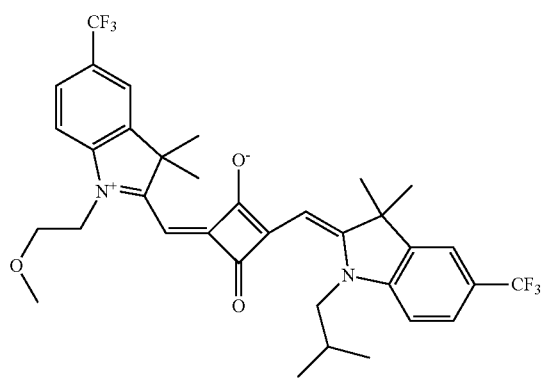
Compound No. 236
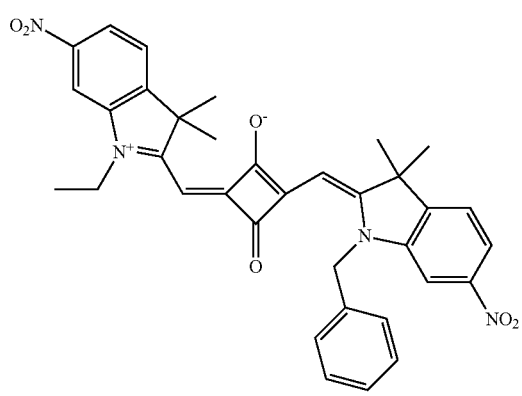
Compound No. 237
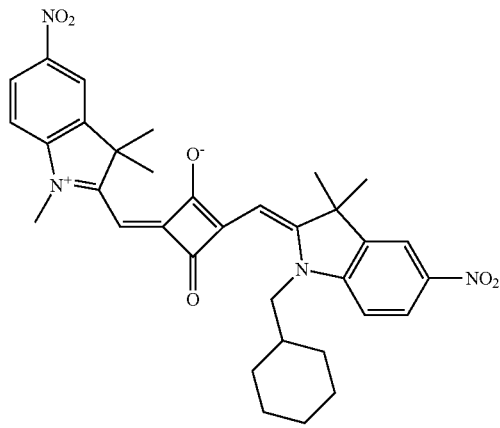
Compound No. 238
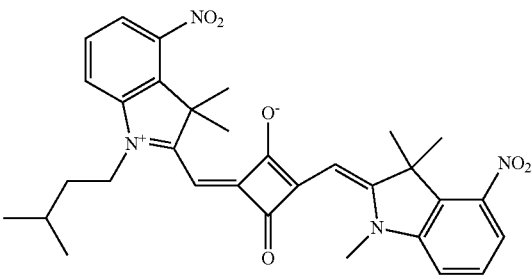
Compound No. 239
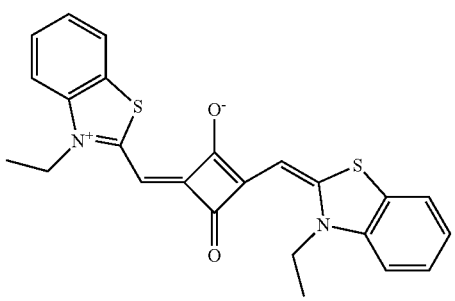
Compound No. 240
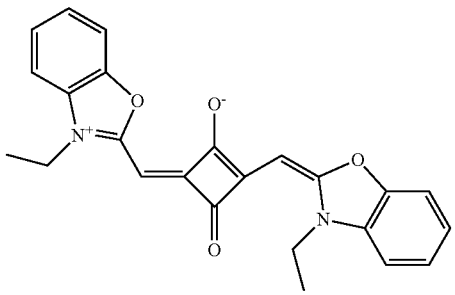

Compound No. 241

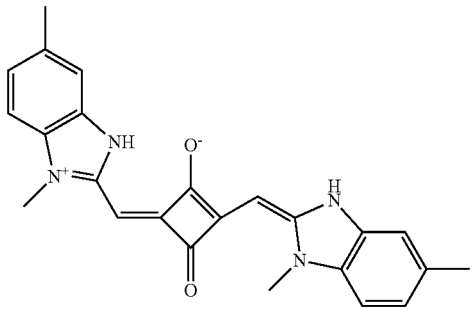

Compound No. 242

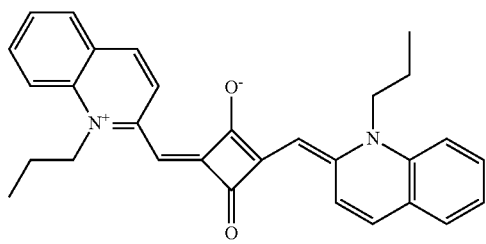

The methods for the production of the squarylium compounds of the present invention represented by the above-mentioned general formulas (1), (2) and (3) are not specifically limited, and the compound can be obtained by methods utilizing well-known general reactions, and examples of the production methods may include methods by synthesizing by a reaction of a compound that induces a ring structure having a corresponding structure and a square acid derivative, such as the routes described in JP 2004-315789 A and JP 2007-199421 A.

The color conversion filter of the present invention can be used for image display devices such as liquid crystal display devices (LCD), plasma display panels (PDP), electroluminescence displays (ELD), anode tube display devices (CRT), fluorescent display tubes and electrical field radiation-type displays, and illumination devices such as LED illuminations and electroluminescence illuminations. In the case when the color conversion filter is used for an image display device, a hue can be corrected to a preferable hue without deteriorating display brightness, and in the case when the color conversion filter is used for an illumination device (specifically an LED illumination), white light that is felt more naturally can be obtained.

The color conversion filter of the present invention may be similar to a conventional optical filter except that it contains at least one squarylium compound that radiates fluorescence light, and the constitution thereof is not limited; for example, as in conventional ones, the color conversion filter has at least a substrate, and can also have various functional layers such as an optical functional layer, a primer layer, an antireflective layer, a hard coat layer and a lubricant layer as necessary. In the color conversion filter of the present invention, the above-mentioned squarylium compound that radiates fluorescence light may be included in either of the substrate and functional layers, and generally, the compound is preferably included in the substrate or optical functional layer. Furthermore, the size and shape of the color conversion filter of the present invention are not specifically limited and suitably determined according to the purpose of use.

Constitutional examples of preferable exemplary embodiments of the color conversion filter of the present invention are shown in FIG. 1 (a) to (c). For example, the color conversion filter includes a substrate 100, and an optical functional layer 120 that contains a squarylium compound that radiates fluorescence light, and where necessary, a primer layer 110, an antireflective layer 130, a hard coat layer 140, a lubricant layer 150 and the like can be disposed. As shown in FIG. 1 (a), the primer layer 110, optical functional layer 120, antireflective layer 130, hard coat layer 140 and lubricant layer 150 may be laminated on one surface of the substrate 100. Alternatively, as shown in FIG. 1 (b), the primer layer 110, optical functional layer 120, hard coat layer 140 and lubricant layer 150 may be laminated on one surface of a transparent substrate, and the primer layer 110, antireflective layer 130 and lubricant layer 150 may be laminated on the other surface. Alternatively, as shown in FIG. 1 (c), the color conversion filter of the present invention may have a structure in which the primer layer 110, antireflective layer 130, hard coat layer 140 and lubricant layer 150 are laminated on the surface of an optical functional substrate 105 containing the squarylium compound that radiates fluorescence light of the present invention.

As the material for the substrate 100, for example, inorganic materials such as glass; and synthetic polymer materials such as polyethylene telephthalate, polymethyl methacrylate, polyvinyl butyral, polyvinyl pyrrolidone, polyvinyl alcohols, polyvinyl chloride, styrene-butadiene copolymers, polystyrene, polycarbonates, polyamides, ethylene-vinyl acetate copolymerized resins, epoxy resins, polyfluorene resins and silicon resins can be used. The substrate 100 has a transmittance of preferably 80% or more, more preferably 86% or more against visible light. The substrate 100 has a haze of preferably 2% or less, more preferably 1% or less. The substrate 100 preferably has a refractive index of 1.45 to 1.70. The thickness of the substrate 100 is suitably selected according to the purpose of use and the like and is not specifically limited, but in general, the thickness is preferably selected from the range of 10 to 10,000 μm.

An infrared ray absorber, an ultraviolet absorber, inorganic microparticles and the like may be added to the respective layer in FIG. 1. Furthermore, the substrate 100 may be subjected to various surface treatments. Examples of the surface treatments include chemical treatments, mechanical treatments, corona discharge treatments, flame treatments, ultraviolet irradiation treatments, high-frequency wave treatments, glow discharge treatments, active plasma treatments, laser treatments, mixed acid treatments, ozone oxidation treatments and the like.

Furthermore, it is also possible to further add a dye that absorbs light in another wavelength region to the optical functional layer 120 or optical functional substrate 105. Examples of the dye that absorbs light in another wavelength region may include, but are not specifically limited to, cyanine-based dyes, pyridine-based dyes, oxazine-based dyes, coumarin-based dyes, coumarin dye-based colorants, naphthalimide-based dyes, pyrromethene-based dye, perylene-based dyes, pyrene-based dyes, anthracene-based dyes, styryl-based dyes, rhodamine-based dyes, azo-based dyes, quinone-based dyes, diketopyrrolopyrrole-based dyes, iridium complex-based dyes, europium-based dyes, naphtholactum-based dyes and the like.

Where necessary, as the constitutional substances for the optical functional layer 120 or optical functional substrate 105, various additives such as binder resins such as photocurable resins, thermosetting resins and thermoplastic resins, photostabilizers, curing agents, infrared ray absorbers, ultraviolet absorbers, antioxidants, surfactants, antistatic agents, flame retarders, lubricants, heavy metal inactivators, hydrotalcite, organic carboxylic acids, colorants, processing aids, inorganic additives, fillers, transparenting agents, nucleating agents and crystallizers can be used.

The form of the optical functional layer 120 or optical functional substrate 105 is not specifically limited as long as it contains at least one kind of squarylium compound that radiates fluorescence light, and may be formed of, for example, a film obtained from a resin liquid in which the above-mentioned squarylium compound is dissolved or dispersed in a binder resin, or may be formed of a single film or laminate formed of only the squarylium compound that is a fluorescent material. The thicknesses of the optical functional layer 120 and optical functional substrate 105 are suitably selected according to the purpose of use and the like and are not specifically limited, but it is preferable that the thickness of the optical functional layer 120 is selected from the range of 0.1 to 100 μm, and the thickness of the optical functional substrate 105 is selected from the range of 10 to 10,000 μm, respectively. Alternatively, the above-mentioned squarylium compound that radiates fluorescence light may be incorporated in the color conversion filter as a form of a filler, a sealant, an adhesive or the like.

Examples of the method for producing the optical functional layer 120 or optical functional substrate 105 may include a deposition process, a sputtering process, and a method in which a coating is formed on a permanent substrate or temporary substrate by a dip coating process, an air knife coating process, a curtain coating process, a roller coating process, a wire bar coating process, a gravure coating process, a spin coating process or an extrusion coating process after dissolving or dispersing in a solvent.

The above-mentioned solvent is not specifically limited, and examples may include water, alcohol-based solvents, diol-based solvents, ketone-based solvents, ester-based solvents, ether-based solvents, aliphatic or alicyclic hydrocarbon-based solvents, aromatic hydrocarbon-based solvents, hydrocarbons having a cyano group, halogenated aromatic hydrocarbon-based solvents and the like.

Alternatively, as a method for producing the optical functional layer 120 or optical functional substrate 105, a self-standing layer may be directly formed by extrusion molding, cast molding or roll molding a mixture containing the squarylium compound that radiates fluorescence light and a polymer material. Polymer materials that can be used include cellulose esters such as diacetyl cellulose, triacetyl cellulose (TAC), propionyl cellulose, butyryl cellulose, acetylpropionyl cellulose and nitrocellulose; polyamides; polycarbonates; polyesters such as polyethylene telephthalate, polyethylene naphthalate, polybutylene telephthalate, poly-1,4-cyclohexanedimethylene telephthalate, polyethylene-1,2-diphenoxyethane-4,4'-dicarboxylate and polybutylene telephthalate; polystyrenes; polyolefins such as polyethylene, polypropylene and polymethylpentene; acrylic-based resins such as polymethyl methacrylate; polycarbonates; polysulfones; polyethersulfones; polyetherketones; polyetherimides; polyoxyethylenes; norbornene resins; ethylene-vinyl acetate copolymer (EVA); polyvinyl butyral (PVB), and the like.

Alternatively, a cured film can also be formed by mixing the squarylium compound that radiates fluorescence light, a photocurable resin and/or a thermosetting resin and a photopolymerization initiator and/or a thermosetting agent, and by light irradiation and/or a heating treatment.

Alternatively, in the case when the color conversion filter of the present invention is used in an application that requires patterning that accompanies wet etching, it can be prepared from a composition formed of the squarylium compound that radiates fluorescence light and a photocurable or light-heat combination use type curable resin (resist). In this case, a cured product of the photocurable or light-heat combination use type curable resin (resist) functions as a binder for the color conversion filter after the patterning. Furthermore, in order to conduct patterning smoothly, it is desirable that the photocurable or light-heat combination use type curable resin is soluble in an organic solvent or alkali solution in an unexposed state. Specific photocurable or light-heat combination use type curable resins (resists) that can be used include (1) a composition formed of acrylic-based multifunctional monomer and oligomer having plural acryloyl groups or methacryloyl groups, and a photo or thermal polymerization initiator, (2) a composition formed of a polyvinylcinnamic acid ester and a sensitizer, (3) a composition formed of a chain or cyclic olefin and bisazide (a nitrene generates and crosslinks the olefin), and (4) a composition formed of a monomer having an epoxy group and an acid generator, and the like. Specifically, it is preferable to use (1) the composition formed of a composition containing acrylic-based multifunctional monomer and oligomer having plural acryloyl groups or methacryloyl groups, and a photo or thermal polymerization initiator. This is because the composition can be patterned with high definition, and provides high reliability such as solvent resistance and heat resistance after the composition is cured by polymerization.

In the color conversion filter of the present invention, it is desirable that the use amount of the squarylium compound that radiates fluorescence light is adjusted to generally within the range of 1 to 10,000 mg/m$^2$, preferably within the range of 10 to 3,000 mg/m$^2$ per a unit surface area of the color conversion filter. By adjusting the use amount to such range, a sufficient color conversion effect is exerted, and suitable color conversion efficiency and photoelectric conversion effect which are suitable for the color conversion light-emitting device and photoelectric conversion device of the present invention are exerted. In order to satisfy the above-mentioned preferable use amount per a unit surface area, it is desirable to form the optical functional layer 120 or optical functional substrate 105 having a thickness in the above-mentioned preferable range by using, for example, a resin liquid in which the squarylium compound that radiates fluorescence light is incorporated at a ratio of 0.001 to 10 parts by mass in 100 parts by mass of a binder resin, but the ratio differs depending on the kind and the like of the binder resin as used. Furthermore, the use amount of the squarylium compound that radiates fluorescence light is preferably adjusted so that the absorbance of the color conversion filter at λmax becomes 0.01 to 1.0.

The antireflective layer 130 is a layer to prevent reflection in the color conversion filter of the present invention to improve light transmittance. The antireflective layer 130 may be a low refractive index layer that is formed of a material having a lower refractive index than that of the substrate 100. The low refractive index layer has a refractive index of preferably 1.20 to 1.55, further preferably 1.30 to 1.50. The low refractive index layer has a thickness of preferably 50 to 400 nm, further preferably 50 to 200 nm. The low refractive index layer can be formed as a layer formed of a fluorine-containing polymer having a low refractive index, a layer obtained by a sol-gel process, or a layer containing microparticles. In the layer containing microparticles, voids can be formed in the low refractive index layer as microvoids between the microparticles or in the microparticles. The layer containing microparticles preferably has a porosity of 3 to 50 volume %, more preferably has a porosity of 5 to 35 volume %.

By forming the antireflective layer 130 from a laminate of one or a plurality of low refractive index layer(s) and one or a plurality of medium or high refractive index layer(s), light reflection in a broader wavelength region can be prevented. The high refractive index layer has a refractive index of preferably 1.65 to 2.40, further preferably 1.70 to 2.20. The refractive index of the medium refractive index layer is adjusted so as to become a value in the middle of the refractive index of the low refractive index layer and the refractive index of the high refractive index layer. The middle refractive index layer has a refractive index of preferably 1.50 to 1.90, further preferably 1.55 to 1.70. The thicknesses of the middle and high refractive index layers are each preferably 5 nm to 100 μm, further preferably 10 nm to 10 μm, and even more preferably 30 nm to 1 μm. The haze in the middle and high refractive index layers is preferably 5% or less, further preferably 3% or less, and even more preferably 1% or less, except the case when an antiglare function mentioned below is imparted.

The middle and high refractive index layers can be formed by using polymer binders having a relatively high refractive index. Examples of polymers having a high refractive index may include polystyrenes, styrene copolymers, polycarbonates, melamine resins, phenol resins, epoxy resins, and polyurethanes obtained by a reaction of a cyclic (alicyclic or aromatic) isocyanate and a polyol. Polymers having other cyclic (aromatic, heterocyclic, alicyclic) group, and polymers having a halogen atom other than fluorine as a substituent also have a high refractive index. A polymer may also be formed by a polymerization reaction of a monomer in which a double bond is introduced to enable radical curing.

In order to obtain a higher refractive index, inorganic microparticles may be dispersed in a polymer binder. The inorganic microparticles to be dispersed preferably has a refractive index of 1.80 to 2.80. The inorganic microparticles are preferably formed of an oxides or sulfide of a metal such as titanium dioxides (for example, rutile, a mixed crystal of rutile/anatase, anatase, an amorphous structure), tin oxide, indium oxide, zinc oxide, zirconium oxide and zinc sulfide. Titanium oxide, tin oxide and indium oxide are specifically preferable. The inorganic microparticles contain these oxides or sulfides of metals as a main component, and can further contain other elements. The main component means a component having the largest content (% by weight) among the components that constitute the particles. Examples of other elements include Ti, Zr, Sn, Sb, Cu, Fe, Mn, Pb, Cd, As, Cr, Hg, Zn, Al, Mg, Si, P and S. Alternatively, the middle and high refractive index layers can be formed by using an inorganic material that is film-formable and can be dispersed in a solvent, or the inorganic material itself is a liquid, such as alkoxides of various elements, salts of organic acids, coordinated compounds that bind to a coordinatable compound (for example, chelate compounds) and active inorganic polymers.

The antireflective layer 130 can impart an antiglare function (a function to scatter incident light on the surface, thereby to prevent the view around the film from reflecting to the film surface) to the surface thereof. For example, an antiglare function can be imparted by forming fine concavity and convexity on the surface on which the antireflective layer 130 is formed (for example, the roughened primer layer 110 or the like), or forming concavity and convexity on the surface of the antireflective layer by an emboss roll or the like. The antireflective layer 130 having an antiglare function generally has a haze of 3 to 30%.

The hard coat layer 140 is a layer to protect a layer that is formed under the hard coat layer (optical functional layer 120 and/or antireflective layer 130), and is formed of a material having a higher hardness than that of the substrate 100. It is preferable that the hard coat layer 140 contains a crosslinked polymer. The hard coat layer can be formed by using an acrylic-based, urethane-based or epoxy-based polymer, oligomer or monomer (for example, an ultraviolet-curable resin). The hard coat layer 140 can also be formed of a silica-based material.

A lubricant layer 150 may be formed on the surface of the color conversion filter of the present invention. The lubricant layer 150 has a function to impart slipping property to the surface of the color conversion filter to thereby improve scratch resistance. The lubricant layer 150 can be formed by using a polyorganosiloxane (for example, silicone oil), a natural wax, a petroleum wax, a higher aliphatic acid metal salt, a fluorine-based lubricant or a derivative thereof. The lubricant layer 150 preferably has a thickness of 2 to 20 nm.

The above-mentioned primer layer 110, antireflective layer 130, hard coat layer 140 and lubricant layer 150 can be formed by any of application methods that are known in the art such as a dip coat process, an air knife coat process, a curtain coat process, a roller coat process, a wire bar coat process, a gravure coat process and an extrusion coat process. In forming the hard coat layer 140 from a silica-based material, the hard coat layer 140 may be formed by using any of film-forming processes that are known in the art such as deposition, sputtering, CVD and laser abrasion.

The respective constitutional layers of the color conversion filter may be formed sequentially one by one according to the order of lamination thereof, or two or more layers may be formed by a simultaneous application process.

Next, the color conversion light-emitting device using the color conversion filter of the present invention will be explained.

The color conversion light-emitting device of the present invention is not specifically limited as long as it has a luminescent part (light source) and the color conversion filter of the present invention as a color conversion part, and can have a similar constitution to that of a conventional color conversion light-emitting device.

Figure 2:
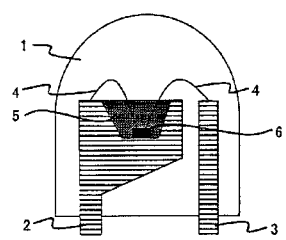
FIG. 2 (a) is a schematic cross-sectional drawing showing a preferable exemplary embodiment of a ballistic LED device that is an example of the color conversion light-emitting device using the color conversion filter of the present invention.
Figure 2:
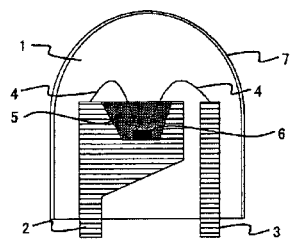
Figure 2:
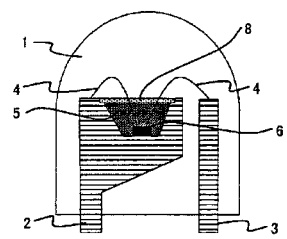
Figure 2:
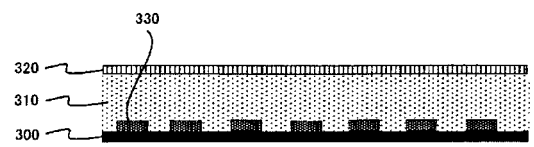
Figure 2:
Figure 2:
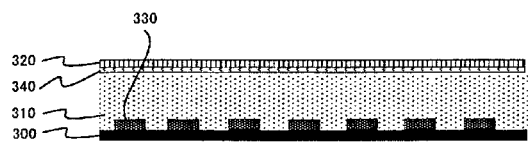

FIGS. 2 (a) to (c) are each a schematic cross-sectional drawing that shows a preferable exemplary embodiment of a ballistic LED device that is an example of the color conversion light-emitting device using the color conversion filter of the present invention. The examples of the color conversion light-emitting devices shown in FIG. 2 (a) to (c) are used for illumination devices and the like using an LED as a light source. Leads 2 and 3 are formed of copper or a copper alloy that is excellent in heat conductivity and electroconductivity, or the like. A wire 4 connects the leads 2 and 3 and an LED element 6, and gold is used. As the LED element 6, a known one can be used. For example, elements that radiate blue light may include GaN-based, InGaN-based, AlP-based, AlInGaN-based elements and the like.

For a sealant resin 1 and/or a sealant resin 5, an epoxy resin and/or a silicon resin or the like are used. A phosphor is incorporated in the sealant resin 5, and inorganic compounds that radiate fluorescence lights of yellow, yellow+red, green+red and the like are used as the phosphor.

In the ballistic LED device of FIG. 2 (a), the squarylium compound that radiates fluorescence light is incorporated in the sealant resin 1 and/or the sealant resin 5. Namely, in the ballistic LED device of FIG. 2 (a), the sealant resin 1 and/or the sealant resin 5 part is the color conversion filter of the present invention.

Alternatively, a color conversion layer may be disposed in the ballistic LED device. FIGS. 2 (b) and (c) are examples of the ballistic LED devices in which a color conversion layer is disposed, and a color conversion layer 7 is disposed in FIG. 2 (b), and a color conversion layer 8 is disposed in FIG. 2 (c). These color conversion layers are the color conversion filters of the present invention, and for example, they are formed by similar production process and materials to those of the color conversion filter as explained in FIG. 1, and may also have various functional layers as necessary.

It is sufficient that the squarylium compound that radiates fluorescence light of the present invention is used in at least one of the above-mentioned sealant resin 1, sealant resin 5, color conversion layer 7 and color conversion layer 8 in the color conversion light-emitting device of the present invention.

Furthermore, as other examples of the color conversion light-emitting device using the color conversion filter of the present invention, examples of color conversion light-emitting devices (illumination devices) having rows of LED chips are shown in FIGS. 2 (d) to (f). For example, in the color conversion light-emitting device of FIG. 2 (d), LED chips 330 are disposed on a substrate 300 (the LED chips may be disposed in not only a straight linear fashion but also arbitrarily on a plane), and a gap between the substrate and an opposed substrate 320 is sealed by a sealant resin 310. In the color conversion light-emitting device of FIG. 2 (d), the squarylium compound that radiates fluorescence light of the present invention is incorporated in the sealant resin 310. Namely, in the color conversion light-emitting device of FIG. 2 (d), the sealant resin 310 part is the color conversion filter of the present invention.

In the color conversion light-emitting devices of FIG. 2 (e) and FIG. 2 (f), a color conversion layer 340 containing the squarylium compound is disposed on or under an opposed substrate and functioned. Namely, in the color conversion light-emitting devices of FIG. 2 (e) and FIG. 2 (f), the color conversion layer 340 part is the color conversion filter of the present invention. In the color conversion light-emitting devices of FIG. 2 (e) and FIG. 2 (f), the squarylium compound may further be used in the sealant resin 310.

Figure 3:
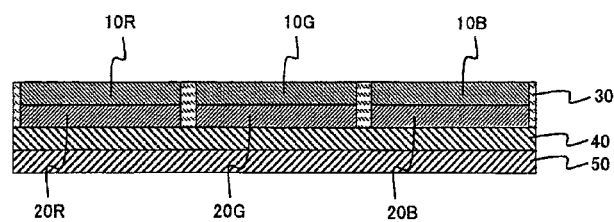
FIG. 3 is a schematic cross-sectional drawing showing another preferable exemplary embodiment of the color conversion light-emitting device using the color conversion filter of the present invention.

Furthermore, as still another example of the color conversion light-emitting device using the color conversion filter of the present invention, a color conversion light-emitting device for a color display is shown in FIG. 3. In the color conversion light-emitting device shown in FIG. 3, a luminescent layer 40 is disposed on a substrate 50. Although a technique to allow luminescence from the luminescent layer 40 is not limited, for example, in the case of an EL (electroluminescence) element, luminescence can be allowed by interposing the luminescent layer in electrodes and passing an electric current.

Furthermore, the color of the light emitted from the luminescent layer 40 can be converted by disposing color conversion layers 20R, 20G and 20B of red, green and blue on the luminescent layer 40. At least one of these color conversion layers is the color conversion filter of the present invention. The color conversion filter may suitably be the color conversion layer 20R, 20G or 20B of red, green or blue depending on the wavelength after the conversion. As the above-mentioned color conversion layer, for example, a color conversion filter formed of a film obtained from a resin liquid in which the squarylium compound that radiates fluorescence light is dissolved or dispersed in a binder resin can be adopted.

Furthermore, color filter layers 10R, 10G and 10B of red, green and blue can be suitably disposed. These color filter layers are disposed as necessary so as to optimize the color coordinate and color purity of the light that has been converted by the color conversion layers 20R, 20G and 20B of red, green and blue.

As a material for the substrate 50, for example, inorganic materials such as glass and synthetic polymer materials which are listed as the materials for the substrate 100 in an optical film can be used. In order to suitably prepare an electrode that allows the luminescence of the luminescent layer 40, glass is preferable as a substrate from which the electrodes are easily formed.

The color filter layers 10R, 10G and 10B having the respective colors each has a function to allow the transmission of only light in a desired wavelength region. The color filter layers 10R, 10G and 10B having the respective colors are effective for blocking the light from the light source which has not undergone wavelength distribution conversion by the color conversion layers 20R, 20G and 20B, and for improving the color purity of the light that has undergone wavelength distribution conversion by the color conversion layers 20R, 20G and 20B. These color filter layers may be formed, for example, by using a color filter material for a liquid crystal display, or the like.

By disposing a plurality of pixels in which each one set of pixel includes the color conversion light-emitting device of RGB shown in FIG. 3 in a matrix-like fashion on a substrate, a color conversion light-emitting device for a color display can be formed. A desired pattern of the color conversion layer depends on the application to be used. A set of regions of one set of pixels having shapes of rectangles or circles of red, green, and blue or intermediates thereof may be formed on the whole surface of a transparent substrate in a matrix-like fashion. Alternatively, two kinds of color conversion layers that are divided in minute areas and disposed at a suitable surface area ratio may be used so as to represent a single color that cannot be attained by only a single color conversion layer.

Although the case when color conversion layers of respective colors of RGB is shown in the example of FIG. 3, in the case when a luminescent element that emits blue light is used as a light source, only a color filter layer may be used without using a color conversion layer with respect to blue color.

Furthermore, as the above-mentioned luminescent part, an optional light source that emits lights in near-ultraviolet to visible regions, preferably in near-ultraviolet to blue green color can be used. Examples of such light source include organic EL luminescent elements, plasma luminescent elements, cold cathode fluorescent lamps, discharge lamps (high pressure and ultrahigh pressure mercury lamps and xenon lamps, and the like), light-emitting diodes and the like.

In the case when a color filter layers are disposed as shown in FIG. 3 in the color conversion light-emitting device of the present invention, a luminescent part is disposed on the side of the color conversion layers.

Furthermore, in the case when color filter layers are not disposed and, for example, a color conversion filter (this does not have color filter layers) shown in FIG. 1 is used as a color conversion part in the color conversion light-emitting device of the present invention, the luminescent part may be disposed on either side of the color conversion filter, or the color conversion filter may be directly laminated on the surface of the light source.

Next, the color conversion light-emitting device using the color conversion filter of the present invention will be explained.

Figure 4:
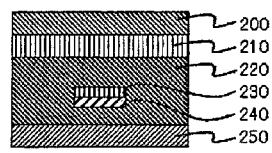
FIG. 4 is a schematic cross-sectional drawing showing a preferable exemplary embodiment of the photoelectric conversion device using the color conversion filter of the present invention.

The photoelectric conversion device of the present invention is not specifically limited as long as it has a photoelectric conversion element and the color conversion filter of the present invention, and may have a similar constitution to that of a conventional photoelectric conversion device. FIG. 4 shows a solar cell as an example of the photoelectric conversion device of the present invention. In the solar cell of FIG. 4, one of or more elements selected from a surface sheet layer 200, a transparent substrate 210, a filler layer 220, a light collecting film 230 and a back sheet layer 250 around the element can be formed into color conversion filter(s) so that a photoelectric conversion element 240 can generate power at a high efficiency. Namely, the periphery elements of the photoelectric conversion element can be formed into the color conversion filters of the present invention by incorporating the squarylium compound that radiates fluorescence light into the periphery elements. Furthermore, besides the above-mentioned respective layers shown in FIG. 4, a color conversion filter layer as the color conversion filter of the present invention may be formed; for example, it is possible to obtain a similar effect by forming a color conversion filter layer by using an adhesive containing the squarylium compound that radiates fluorescence light between the layers.

Although the photoelectric conversion device of the present invention is not specifically limited, examples may include silicon type solar cells of a single crystal type, a polycrystalline type, an amorphous silicon type and the like; compound-based solar cells such as a GaAs-based, a CIS-based, a $Cu_2ZnSnS_4$-based and a CdTe—CdS-based solar cells; organic-based solar cells such as a dye-synthesized type and an organic thin film type.

EXAMPLES

Hereinafter the present invention will be explained in more detail based on Examples and Comparative Examples. However, the present invention is not limited at all by the following Examples and the like.

Examples 1 to 12 and Comparative Example 1

The test compound described in [Table 1] was dissolved in a toluene solution of 25 wt % polymethyl methacrylate that had been prepared in advance so that the absorbance at λmax became 0.5, applied on a polyethylene telephthalate (PET) film substrate of 100 μm by a wire bar (RDS30R. D. S. Webster, N.Y.), and heated under a condition of 100° C. for 10 minutes in an oven to give a color conversion filter of the present invention.

For the obtained color conversion filter, λmax of each film was measured as excited light by using a spectrophotometer U-3010 manufactured by Hitachi High-Technologies Corporation for an absorption spectrum, and using a spectrophotometer F4500 manufactured by Hitachi High-Technologies Corporation for a fluorescence spectrum. The quantum efficiency was obtained by measuring around λmax of each film as excited light by using an absolute PL quantum yield measurement device C9920-02G manufactured by Hamamatsu Photonics K. K., and calculating from a surface area ratio. The results are shown in the following [Table 1].

[Chemical Formula 4]

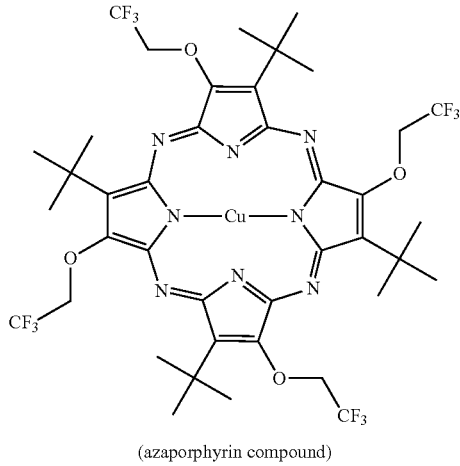

Comparative Compound No.1

(azaporphyrin compound)

TABLE 1

| Test Compound | | λ max (nm) | FLmax (nm) | Quantum efficiency (%) | Stokes shift (nm) |
|---|---|---|---|---|---|
| Example 1 | Compound No. 5 | 598 | 617 | 39.7 | 19 |
| Example 2 | Compound No. 68 | 595 | 617 | 26.4 | 22 |
| Example 3 | Compound No. 69 | 596 | 618 | 29.5 | 22 |
| Example 4 | Compound No. 70 | 594 | 616 | 39.7 | 22 |
| Example 5 | Compound No. 71 | 591 | 613 | 23.3 | 22 |
| Example 6 | Compound No. 72 | 598 | 619 | 9.0 | 21 |
| Example 7 | Compound No. 101 | 589 | 622 | 53.6 | 33 |
| Example 8 | Compound No. 123 | 595 | 623 | 18.1 | 28 |
| Example 9 | Compound No. 124 | 587 | 618 | 40.0 | 31 |
| Example 10 | Compound No. 206 | 639 | 656 | 36.6 | 17 |
| Example 11 | Compound No. 239 | 670 | 685 | 21.0 | 15 |
| Example 12 | Compound No. 240 | 586 | 601 | 17.9 | 15 |
| Comparative Example 1 | Comparative Compound No. 1 | 591 | 619 | 1.5 | 28 |

Accordingly, since the color conversion filters of Examples 1 to 12 have a color conversion capability, it is obvious that they are preferable for color conversion light-emitting devices and photoelectric conversion devices. Specifically, since the color conversion filters of Examples 1 to 9 and 12 absorb light in a wavelength of 570 to 600 nm in an LED illumination and converts the wavelength to 600 to 700 nm that is preferable for illumination, they are preferable as color conversion filters for LED illuminations.

REFERENCE SIGNS LIST

1 Sealant resin
2 Lead
3 Lead
4 Wire
5 Sealant resin
6 LED element
7 Color conversion layer
8 Color conversion layer
10R Red filter layer
10G Green filter layer
10B Blue filter layer
20R Red conversion layer
20G Green color conversion layer 20B Blue conversion layer
30 Black mask
40 Luminescent layer
50 Substrate
100 Substrate
105 Optical functional substrate
110 Primer layer
120 Optical functional layer
130 Antireflective layer
140 Hard coat layer
150 Lubricant layer
200 Surface sheet layer
210 Transparent substrate
220 Filler layer
230 Light collecting film
240 Photoelectric conversion element
250 Back sheet layer
300 Substrate
310 Sealant resin
320 Opposed substrate
330 LED chip
340 Color conversion layer

The invention claimed is:

1. A color conversion light-emitting device comprising:
a luminescent part; and
a color conversion filter having a wavelength conversion capability, which contains at least one kind of squarylium dye that radiates fluorescence light, wherein the squarylium dye is a compound represented by the following general formula (1), (2) or (3):

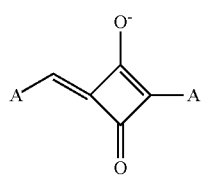
(1)

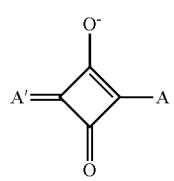
(2)

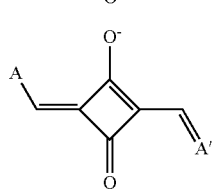
(3)

wherein A represents a group selected from (a) to (k) in the following Group I, and A' represents a group selected from (a') to (k') in the following Group II;

Group I

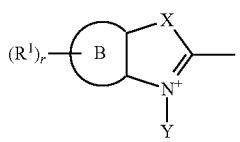
(a)

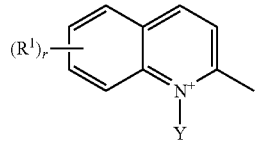
(b)

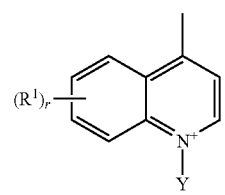
(c)

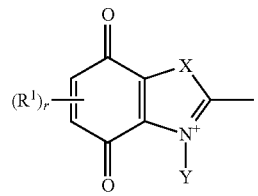
(d)

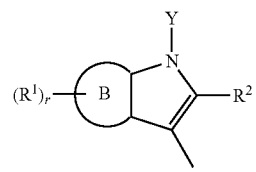
(e)

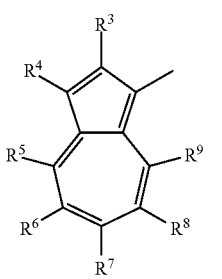
(f)

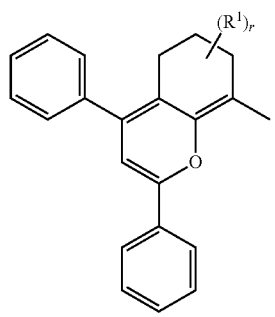
(g)

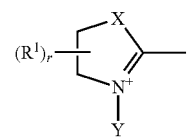
(h)

55
-continued

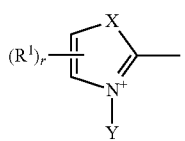 (i)

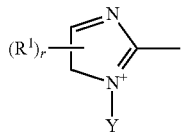 (j)

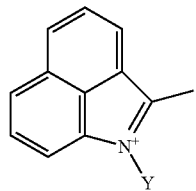 (k)

Group II

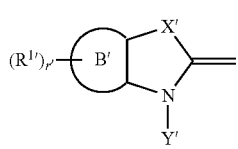 (a')

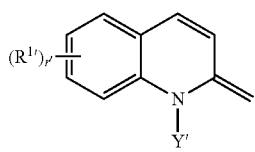 (b')

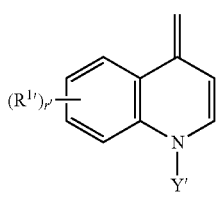 (c')

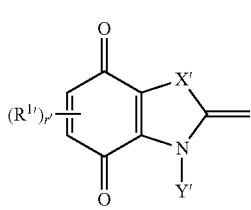 (d')

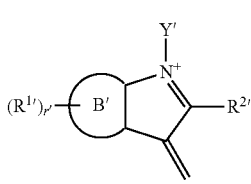 (e')

56
-continued

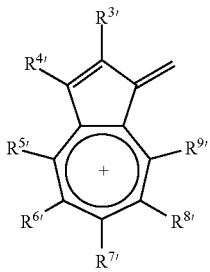 (f')

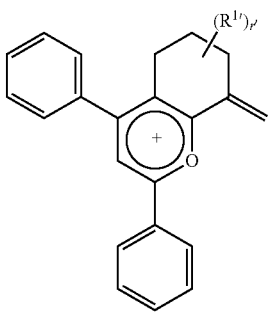 (g')

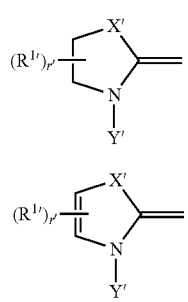 (h')

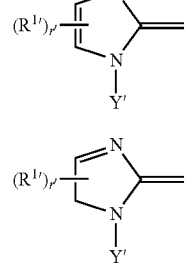 (i')

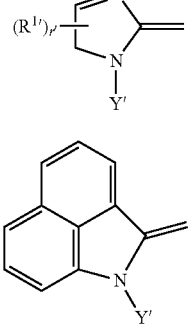 (j')

(k')

wherein ring B and ring B' each represents a benzene ring, a naphthalene ring, a phenanthrene ring or a pyridine ring, $R^1$ and $R^{1\prime}$ each represents a halogen atom, a nitro group, a cyano group, an aryl group having 6 to 30 carbon atoms, an arylalkyl group having 7 to 30 carbon atoms, an alkyl group having 1 to 8 carbon(s), a halogen-substituted alkyl group having 1 to 8 carbon atom(s), an alkoxy group having 1 to 8 carbon atom(s), a halogen-substituted alkoxy group having 1 to 8 carbon atom(s), or an ether group having 2 to 8 carbon atoms, $R^2$ and $R^{2\prime}$ each represents a hydrogen atom, a halogen atom, an aryl group having 6 to 30 carbon atoms, an arylalkyl group having 7 to 30 carbon atoms, or an alkyl group having 1 to 8 carbon atom(s), $R^3$ to $R^9$ and $R^{3'}$ to $R^{9'}$ each represents a hydrogen atom, a halogen atom, an alkyl group having 1 to 8 carbon atom(s), or a group that forms a condensed ring with the adjacent substituent, X and X' each represents an oxygen atom, a sulfur atom, a selenium atom, —$CR^{51}R^{52}$—, a cycloalkane-1,1-diyl group having 3 to 6 carbon atoms, —NH— or —$NY^2$—, $R^{51}$ and $R^{52}$ each represents an alkyl group having 1 to 20 carbon atom(s), an aryl group having 6 to 30 carbon atoms or an arylalkyl group having 7 to 30 carbon atoms, which is optionally substituted by a hydroxyl group, a halogen atom, a cyano group or a nitro group, or a hydrogen atom, Y, Y' and $Y^2$ each represents a hydrogen atom, or an alkyl group having 1 to 20 carbon atom(s), aryl group having 6 to 30 carbon atoms or an arylalkyl group having 7 to 30 carbon atoms, which is optionally substituted by a hydroxyl group, a halogen atom, a cyano group or a nitro group, wherein the methylene group in the alkyl group and arylalkyl group in the Y, Y' and $Y^2$ is optionally substituted by —O—, —S—, —CO—, —COO—, —OCO—, —$SO_2$—, —NH—, —CONH—, —NHCO—, —N=CH— or —CH=CH—, and r and r' each represents 0 or a number that can be substituted in (a) to (k) or (a') to (k').

2. The color conversion light-emitting device according to claim 1, wherein the luminescent part is an LED element.

3. A photoelectric conversion device comprising:

a photoelectric conversion element; and a color conversion filter having a wavelength conversion capability, which contains at least one kind of squarylium dye that radiates fluorescence light, wherein the squarylium dye is a compound represented by the following general formula (1), (2) or (3):

(1)
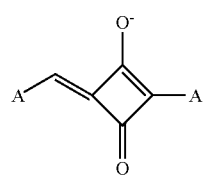

(2)
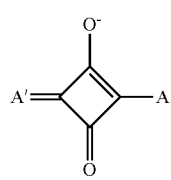

(3)
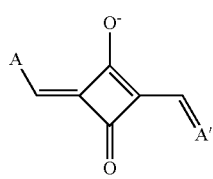

wherein A represents a group selected from (a) to (k) in the following Group I, and A' represents a group selected from (a') to (k') in the following Group II;

Group I (a)
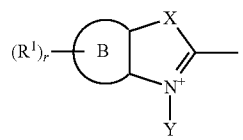

(b)
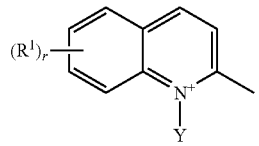

(c)
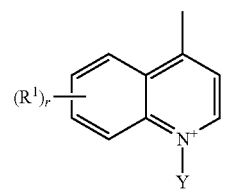

(d)
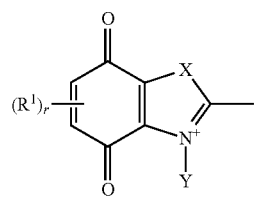

(e)
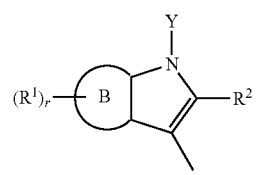

(f)
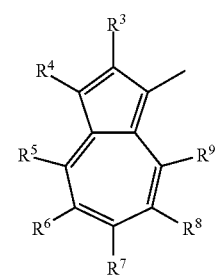

(g)
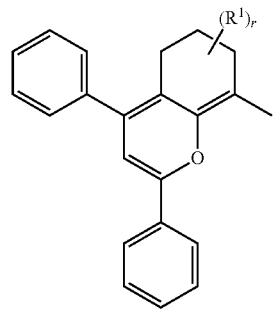

(h)
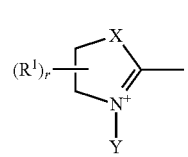

-continued

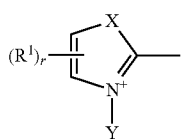 (i)

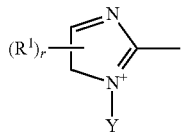 (j)

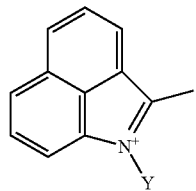 (k)

Group II

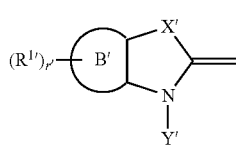 (a')

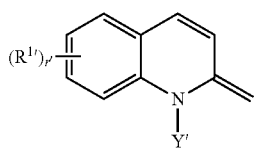 (b')

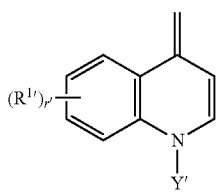 (c')

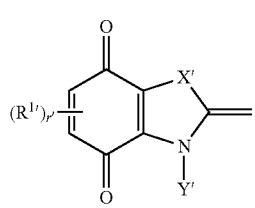 (d')

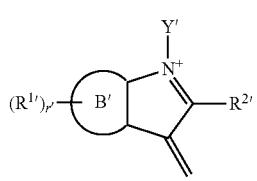 (e')

-continued

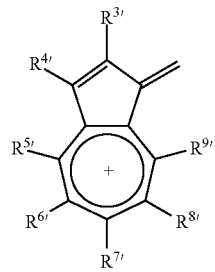 (f')

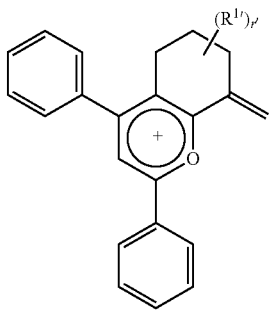 (g')

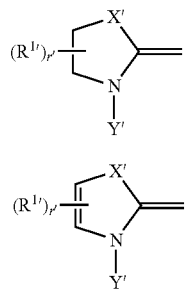 (h')

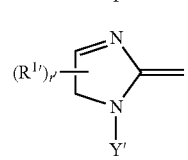 (i')

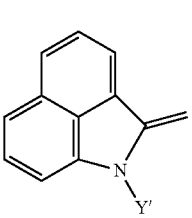 (j')

(k')

wherein ring B and ring B' each represents a benzene ring, a naphthalene ring, a phenanthrene ring or a pyridine ring, $R^1$ and $R^{1\prime}$ each represents a halogen atom, a nitro group, a cyano group, an aryl group having 6 to 30 carbon atoms, an arylalkyl group having 7 to 30 carbon atoms, an alkyl group having 1 to 8 carbon(s), a halogen-substituted alkyl group having 1 to 8 carbon atom(s), an alkoxy group having 1 to 8 carbon atom(s), a halogen-substituted alkoxy group having 1 to 8 carbon atom(s), or an ether group having 2 to 8 carbon atoms, $R^2$ and $R^{2\prime}$ each represents a hydrogen atom, a halogen atom, an aryl group having 6 to 30 carbon atoms, an arylalkyl group having 7 to 30 carbon atoms, or an alkyl group having 1 to 8 carbon atom(s), $R^3$ to $R^9$ and $R^{3\prime}$ to $R^{9\prime}$ each represents a hydrogen atom, a halogen atom, an alkyl group having 1 to 8 carbon atom(s), or a group that forms a condensed ring with the adjacent substituent, X and X' each represents an oxygen atom, a sulfur atom, a selenium atom, —$CR^{51}R^{52}$—, a cycloalkane-1,1-diyl group having 3 to 6 carbon atoms, —NH— or —$NY^2$—, $R^{51}$ and $R^{52}$ each represents an alkyl group having 1 to 20 carbon atom(s), an aryl group having 6 to 30 carbon atoms or an arylalkyl group having 7 to 30 carbon atoms, which is optionally substituted by a hydroxyl group, a halogen atom, a cyano group or a nitro group, or a hydrogen atom, Y, Y' and $Y^2$ each represents a hydrogen atom, or an alkyl group having 1 to 20 carbon atom(s), aryl group having 6 to 30 carbon atoms or an arylalkyl group having 7 to 30 carbon atoms, which is optionally substituted by a hydroxyl group, a halogen atom, a cyano group or a nitro group, wherein the methylene group in the alkyl group and arylalkyl group in the Y, Y' and $Y^2$ is optionally substituted by —O—, —S—, —CO—, —COO—, —OCO—, —$SO_2$—, —NH—, —CONH—, —NHCO—, —N=CH— or —CH=CH—, and r and r' each represents 0 or a number that can be substituted in (a) to (k) or (a') to (k').

\* \* \* \* \*